US010607873B2

(12) United States Patent
Janda et al.

(10) Patent No.: US 10,607,873 B2
(45) Date of Patent: Mar. 31, 2020

(54) SUBSTRATE EDGE DETECTION

(71) Applicant: ASML NETHERLANDS B.V., Veldhoven (NL)

(72) Inventors: Eric Anthony Janda, Chandler, AZ (US); Cayetano Sánchez-Fabrés Cobaleda, Eindhoven (NL); Bernd Peter Geh, Scottsdale, AZ (US); Simon Gijsbert Josephus Mathijssen, Rosmalen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/086,367

(22) PCT Filed: Mar. 23, 2017

(86) PCT No.: PCT/EP2017/056926
§ 371 (c)(1),
(2) Date: Sep. 19, 2018

(87) PCT Pub. No.: WO2017/167637
PCT Pub. Date: Oct. 5, 2017

(65) Prior Publication Data
US 2019/0101839 A1    Apr. 4, 2019

Related U.S. Application Data

(60) Provisional application No. 62/315,491, filed on Mar. 30, 2016.

(51) Int. Cl.
*G03F 9/00* (2006.01)
*H01L 21/67* (2006.01)
(Continued)

(52) U.S. Cl.
CPC ........ *H01L 21/681* (2013.01); *G03F 7/70775* (2013.01); *G03F 9/7049* (2013.01);
(Continued)

(58) Field of Classification Search
CPC .. G03F 7/70775; G03F 9/7049; G03F 9/7065; G03F 9/7076; G03F 9/7088; G03F 9/7092
See application file for complete search history.

(56) References Cited

U.S. PATENT DOCUMENTS 4,422,763 A   12/1983   Kleinknecht
4,655,598 A    4/1987   Murakami et al.
(Continued)

FOREIGN PATENT DOCUMENTS

WO        2005114723        12/2005

OTHER PUBLICATIONS

International Search Report and Written Opinion issued in corresponding PCT Patent Application No. PCT/EP2017/056926, dated Jul. 6, 2017.

*Primary Examiner* — Michelle M Iacoletti
(74) *Attorney, Agent, or Firm* — Pillsbury Winthrop Shaw Pittman LLP

(57) ABSTRACT

A method including directing, by an optical system, an illumination beam to a surface of a substrate, providing relative motion between the directed illumination beam and the substrate until the directed illumination beam is illuminated on a grating underneath an edge or a notch of the substrate, diffracting, by the grating, at least a portion of the illumination beam, and detecting, by the detector, the diffracted illumination.

21 Claims, 18 Drawing Sheets

(51) Int. Cl.
  *H01L 21/68*   (2006.01)
  *G03F 7/20*    (2006.01)

(52) U.S. Cl.
  CPC .......... *G03F 9/7065* (2013.01); *G03F 9/7076* (2013.01); *G03F 9/7088* (2013.01); *G03F 9/7092* (2013.01); *H01L 21/67259* (2013.01)

(56) References Cited

U.S. PATENT DOCUMENTS

| | | |
|---|---|---|
| 4,948,983 A | 8/1990 | Maruyama et al. |
| 5,114,236 A | 5/1992 | Matsugu et al. |
| 5,151,750 A | 9/1992 | Magome et al. |
| 5,225,892 A | 7/1993 | Matsugu et al. |
| 5,559,601 A | 9/1996 | Gallatin et al. |
| 5,610,715 A | 3/1997 | Yoshii et al. |
| 5,801,390 A | 9/1998 | Shiraishi |
| 5,920,396 A | 7/1999 | Markoya et al. |
| 6,045,101 A | 4/2000 | Goyette et al. |
| 6,469,793 B1 | 10/2002 | Stanton |
| 6,864,956 B1 | 3/2005 | Teong et al. |
| 2003/0081188 A1 | 5/2003 | Suzuki |
| 2004/0179181 A1 | 9/2004 | Van Der Zouw |
| 2005/0156334 A1 | 7/2005 | Froebel et al. |
| 2005/0248754 A1 | 11/2005 | Wang et al. |
| 2006/0138410 A1 | 6/2006 | Lalbahadoersing et al. |
| 2006/0285095 A1 | 12/2006 | Van Buel et al. |
| 2007/0045566 A1 | 3/2007 | McGinley et al. |
| 2007/0058172 A1 | 3/2007 | Van Der Pasch et al. |
| 2007/0085988 A1 | 4/2007 | Kim |
| 2008/0013089 A1 | 1/2008 | Ishii et al. |
| 2009/0026657 A1 | 1/2009 | Nimmakayala et al. |
| 2009/0128792 A1 | 5/2009 | Pellens et al. |
| 2010/0214569 A1 | 8/2010 | Shim |
| 2012/0212749 A1 | 8/2012 | Den Boef et al. |
| 2013/0230797 A1 | 9/2013 | Van Der Sanden et al. |
| 2015/0370175 A1 | 12/2015 | Nicolaides et al. |
| 2016/0153811 A1 | 6/2016 | Tamura |
| 2018/0356742 A1* | 12/2018 | Sanchez-Fabres Cobaleda ......... G03F 9/7011 |

\* cited by examiner

SUBSTRATE EDGE DETECTION

CROSS-REFERENCE TO RELATED APPLICATIONS

This application is the U.S. national phase entry of PCT patent application no. PCT/EP2017/056926, which was filed on Mar. 23, 2017, which claims the benefit of priority of U.S. provisional application No. 62/315,491, which was filed on Mar. 30, 2016, and which is incorporated herein in its entirety by reference.

FIELD

The present description relates to a method and apparatus for alignment of a substrate in, for example, in a lithographic apparatus and/or in manufacture of devices using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, one or more alignment marks are generally provided on, for example, the substrate, and the lithographic apparatus includes one or more alignment sensors by which the position of the mark may be measured accurately. The alignment sensor may be effectively a position measuring apparatus. Different types of marks and different types of alignment sensors are known from different times and different manufacturers.

Known alignment sensors use one or several radiation sources to generate a plurality of radiation beams with different wavelengths and/or polarizations. In this fashion, a sensor may measure position using several wavelengths (e.g., colors) and/or polarizations of radiation (e.g., light) on a same target grating or gratings. No single color or polarization is ideal for measuring in all situations, so the system selects from a number of signals, which one provides the most reliable position information.

SUMMARY

As substrates become increasingly complex, with increasing numbers of patterns being applied to them, additional wavelengths and/or polarizations may be needed in order to ensure the ability of the alignment sensor to provide reliable position information. The addition of more patterns may reduce the amount of radiation scattered by alignment marks on the substrate. Furthermore, some patterns may be made of materials that are opaque to the radiation used by the alignment sensor. To mitigate this, even more complexity may need to be added to the alignment system. However, given the physical constraints on the alignment sensor, since it has to fit within the lithographic apparatus, this may not be feasible or desirable.

Furthermore, methods to increase the visibility of alignment marks to the radiation emitted by the alignment system are time consuming. This slows down the production speed of the lithographic apparatus. Additionally, the methods may require additional patterns to be applied, each of which must itself be aligned with the substrate.

So, it is desirable, for example, to determine a position of a substrate by accurately determining the position of an edge and/or notch of the substrate without necessarily using additional processing steps, such as the application of additional patterns or layers to the substrate.

In an embodiment, there is provided a method comprising: directing, by an optical system, an illumination beam to a surface of a substrate; providing relative motion between the directed illumination beam and the substrate until the directed illumination beam is illuminated on a grating underneath an edge or a notch of the substrate; diffracting, by the grating, at least a portion of the illumination beam; and detecting, by the detector, the diffracted illumination. Determining the position of the boundary may include detecting diffracted illumination after essentially not detecting any illumination when the directed illumination beam was incident on a surface of the substrate. The method may include preventing, by a block, a reflected portion of the directed illumination beam from reaching the detector. Alternatively or additionally, the method may include determining a center or orientation of the substrate from a plurality of positions determined based on the detected diffracted illumination.

In an embodiment, there is provided a method comprising: directing, by an optical system, an illumination beam to a surface of a substrate; providing relative motion between the directed illumination beam and the substrate until the directed illumination beam is illuminated on a structure underneath an edge or a notch of the substrate; redirecting, by the structure, at least a portion of the illumination beam with a redirection angle different than the incident angle; and detecting, by the detector, the redirected illumination. Additionally, the method may include determining a center or orientation of the substrate from a plurality of positions determined based on the detected diffracted illumination.

In an embodiment, there is provided a method comprising: directing, by an optical system, an illumination beam to a surface of a substrate; providing relative motion between the directed illumination beam and the substrate to transition the directed illumination from being incident on an interior of the substrate toward being no longer incident on the substrate until at least the directed illumination beam is incident on an edge or a notch of the substrate; redirecting at least a portion of the illumination beam by the substrate; and detecting, by a detector, essentially only $0^{th}$ order redirected illumination, wherein the detector transitions from observing $0^{th}$ order redirected illumination for the interior of the substrate and observing essentially no $0^{th}$ order redirected illumination when the edge or notch is reached. The method may include preventing, by a block, non-$0^{th}$ order redirected illumination from reaching the detector. In an embodiment, there is provided an apparatus comprising: a substrate stage configured to support a substrate; an optical system configured to direct an illumination beam to a surface of the substrate; a structure underneath an edge or a notch of the substrate when held by the substrate stage, the structure configured to scatter at least a portion of the directed illumination beam at a redirection angle other than the incident angle of the directed illumination beam to the structure; a detector configured to receive the scattered illumination beam from the structure; and an actuator configured to provide relative motion between the directed illumination beam and the substrate until the directed illumination beam is illuminated on the structure. The structure may include a grating. The grating may be a grating with features having a direction of elongation extending away, at the portion of the edge or notch underneath which the grating is located, from a central region of the substrate. A grating period of the grating may be determined based on a numerical factor of a pupil stop, a numerical factor of the optical system, a wavelength of the illumination beam, and a focal length of an objective. The apparatus may include a block configured to prevent a reflected portion of the directed illumination beam from reaching the detector. Also, the apparatus may include a control system which may be configured to determine a position of the boundary of the edge or the notch based on the detected scattered illumination beam from the structure or which may be configured to determine a center or orientation of the substrate based on the detected scattered illumination beam from the structure. The control system configured to determine the position of the boundary may do so by detecting diffracted illumination after essentially not detecting any illumination when the directed illumination beam was incident on a surface of the substrate.

Features and/or advantages of embodiments, as well as the structure and operation of various embodiments, are described in detail herein with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
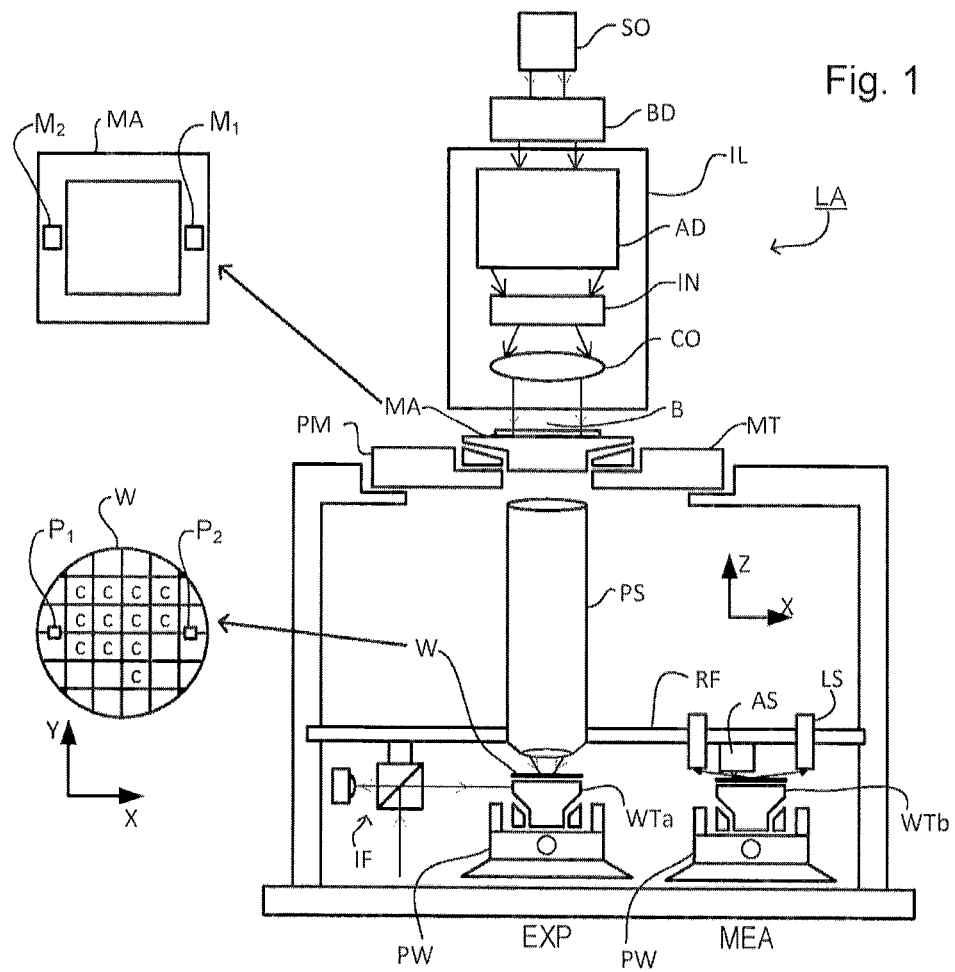
FIG. 1 schematically depicts a lithographic apparatus including a sensor system.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular and/or spatial intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. An embodiment of an alignment system, which can detect the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
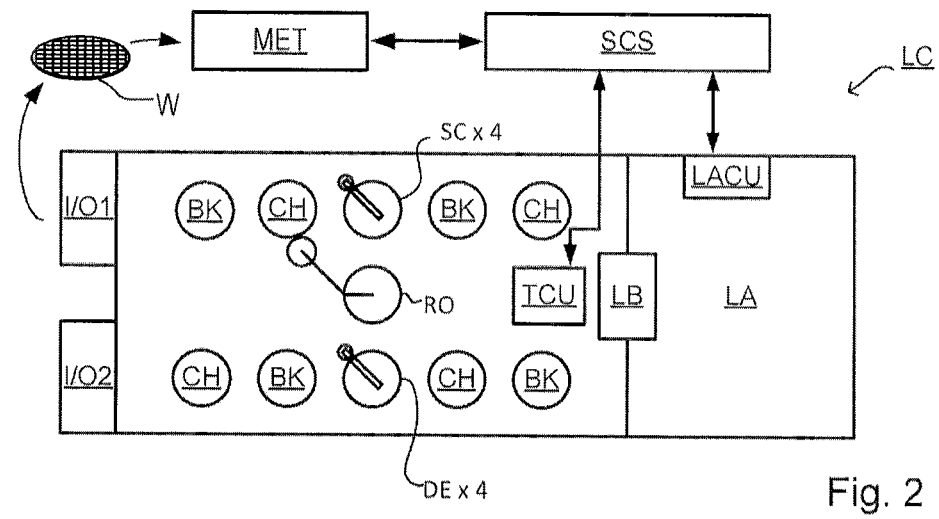
FIG. 2 schematically depicts a lithographic cell or cluster in which an embodiment of a sensor system may be used.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency. The substrates processed by the track are then transferred to other processing tools for etching and other chemical or physical treatments within the device manufacturing process.

The lithographic apparatus control unit LACU controls all the movements and measurements of the various actuators and sensors described. LACU also includes signal processing and data processing capacity to implement desired calculations relevant to the operation of the apparatus. In the terminology of the introduction and claims, the combination of these processing and control functions referred to simply as the "controller". In practice, control unit LACU will be realized as a system of many sub-units, each handling the real-time data acquisition, processing and control of a sub-system or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

Figure 3:
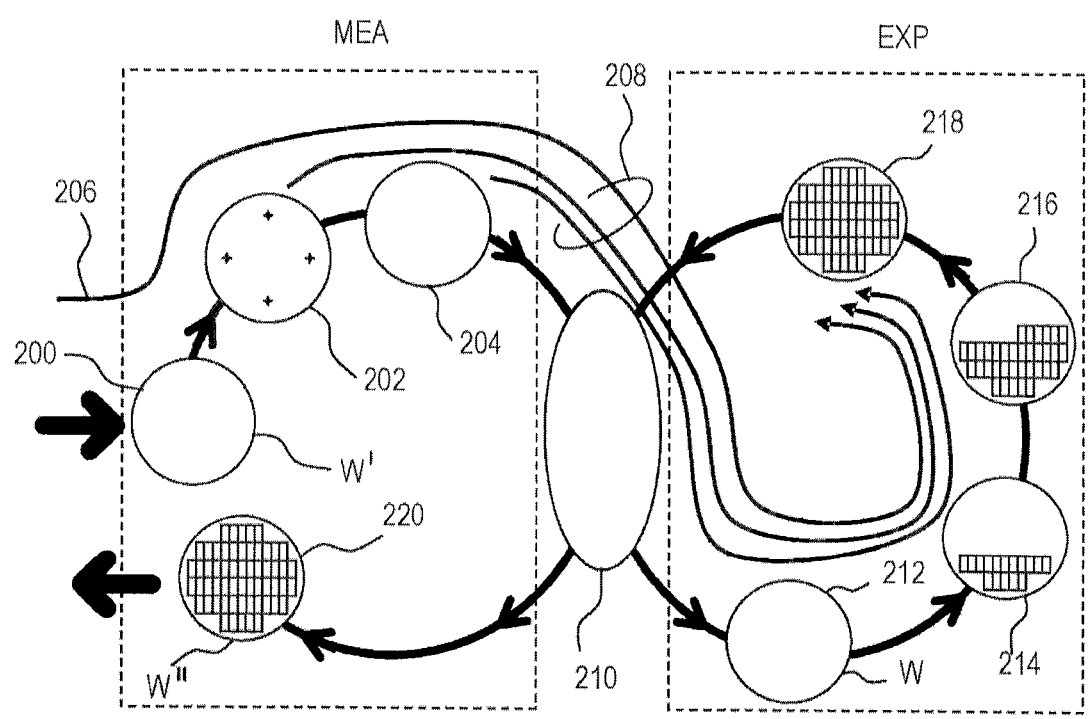
FIG. 3 illustrates the steps to expose target portions (e.g. dies) on a substrate W in the dual stage apparatus of FIG. 1.

FIG. 3 illustrates the example steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. In an embodiment, two substrates are processed in parallel in order to increase the throughput of the lithographic apparatus.

Referring initially to the newly-loaded substrate W', this may be a previously unprocessed substrate, prepared with a new photoresist for first time exposure in the apparatus. In general, however, the lithography process described will be merely one step in a series of exposure and processing steps, so that substrate W' may have been through this apparatus and/or other lithography apparatuses, several times already, and may have subsequent processes to undergo as well. Particularly for the problem of improving overlay performance, the task is to help ensure that new patterns are applied in exactly a correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1, etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "substrate grid", which maps very accurately the distribution of marks across the substrate, including any distortion relative to a nominal rectangular grid.

At step 204, a map of substrate height (Z) against X-Y position is measured using the level sensor LS. Conventionally, the height map is used to achieve accurate focusing of the exposed pattern. As will be explained further below, the present apparatus may use height map data to supplement the alignment measurements.

With loading of substrate W', recipe data 206 was received, defining the exposures to be performed, and also properties of the substrate and the patterns previously made and to be made upon it. To this recipe data is added the measurements of substrate position, substrate grid and/or height map made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. The alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further in U.S. patent application publication no. 2013-0230797, which is incorporated herein in its entirety by reference, advanced models can be used with more parameters.

At 210, substrates W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, patterning device alignment is performed using the patterning device alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labelled W" is unloaded from the apparatus at step 220, to undergo etching or other processes, in accordance with the exposed pattern.

Figure 4:
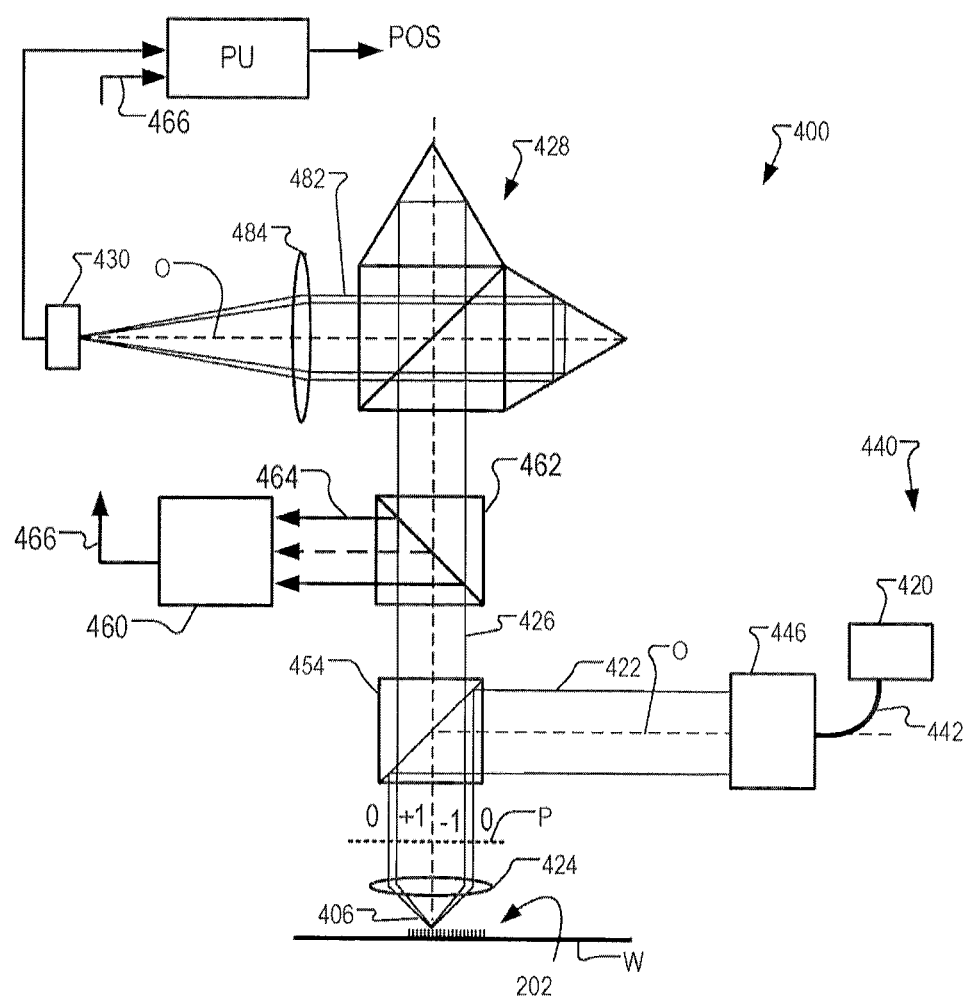
FIG. 4 schematically depicts an alignment sensor system for used in the apparatus of FIG. 1 or FIG. 2.

FIG. 4 illustrates an optical system 400 of an alignment sensor. An optical axis O which has several branches is indicated by a broken line running throughout the optical system 400. The optical system has a radiation source 420, an illumination beam 422, an objective 424, an information carrying beam 426, a self-referencing interferometer 428 and a detector 430. In practice, multiple detectors may be provided. Signals from the detector are processed by processing unit PU to arrive at position/alignment data POS.

Additional components illustrated in this schematic diagram are as follows. In an illumination subsystem 440, radiation from source 420 is delivered via an optical fiber 442 to an illumination profiling optic 446. The optic 446 delivers input beam 422 via optical element 454 to objective 424 having a pupil plane P. Objective 424 forms a spot 406 on alignment mark 202 formed on substrate W. The substrate is positioned on a substrate stage (not shown), which may be moved relative to the optical system. The skilled person will, of course, realize that the relative movement can be implemented in a number of specific ways. In one example the optical system is stationary and the stage moves. In another example, the optical system moves and the stage is stationary. In yet another example, the stage moves in at least one dimension, and the optical system moves in at least one other dimension.

Information-carrying beam 426, diffracted by the mark and shown in terms of the zero, $+1^{st}$, $-1^{st}$, etc. diffraction orders, passes through beam optical element 454 to interferometer 428. Interferometer 428 splits the radiation field into two parts with orthogonal polarization, rotates these parts about the optical axis by 180° relative to one another, and combines them into an outgoing beam 482. A lens 484 focuses the entire field onto a detector 430. The detector 430 in this example and in the alignment sensor are effectively single photodiodes and do not provide any spatial information except by the scanning motion described already. A detector having spatial resolution in a conjugate pupil plane can be added, to allow an angle-resolved scatterometry method to be performed using the alignment sensor hardware.

Included in the present example is an asymmetry measuring arrangement 460, which outputs data 466 to processing unit PU. Arrangement 460 receives a part 464 of the information carrying beam 426 via a beam splitter 462 positioned in advance of the interferometer 428.

It should be noted that in the example shown in FIG. 4 some optical elements used in practice around the interferometer have been omitted. This is only done to simplify the explanation of this idea. In a real implementation they may need to be included.

In some scenarios, the alignment marks cannot be found for use by an alignment system because of the manufacturing process. As described above, the alignment marks used by the alignment sensor may become obscured or invisible to the radiation beam used during the alignment process. One or several of the layers deposited on top of the alignment marks may be wholly or partially opaque to the radiation beam used by the alignment sensor. Thus, for example, poor substrate quality, one or more layers on top of the alignment marks, etc. can prevent accurate localization of the marks for alignment measurement. If the alignment marks cannot be found, alignment cannot be performed, which results in a substrate which cannot be aligned and therefore cannot be exposed.

One way to make the alignment marks visible is to open an optical window on top of the alignment marks, in such a way that essentially only the material which is located on top of the alignment marks is removed and therefore the alignment marks can be measured. This optical window, known as a clear-out window, should be done with an accuracy such that only a specific area of the substrate is etched to make the clear-out window.

Figure 5:
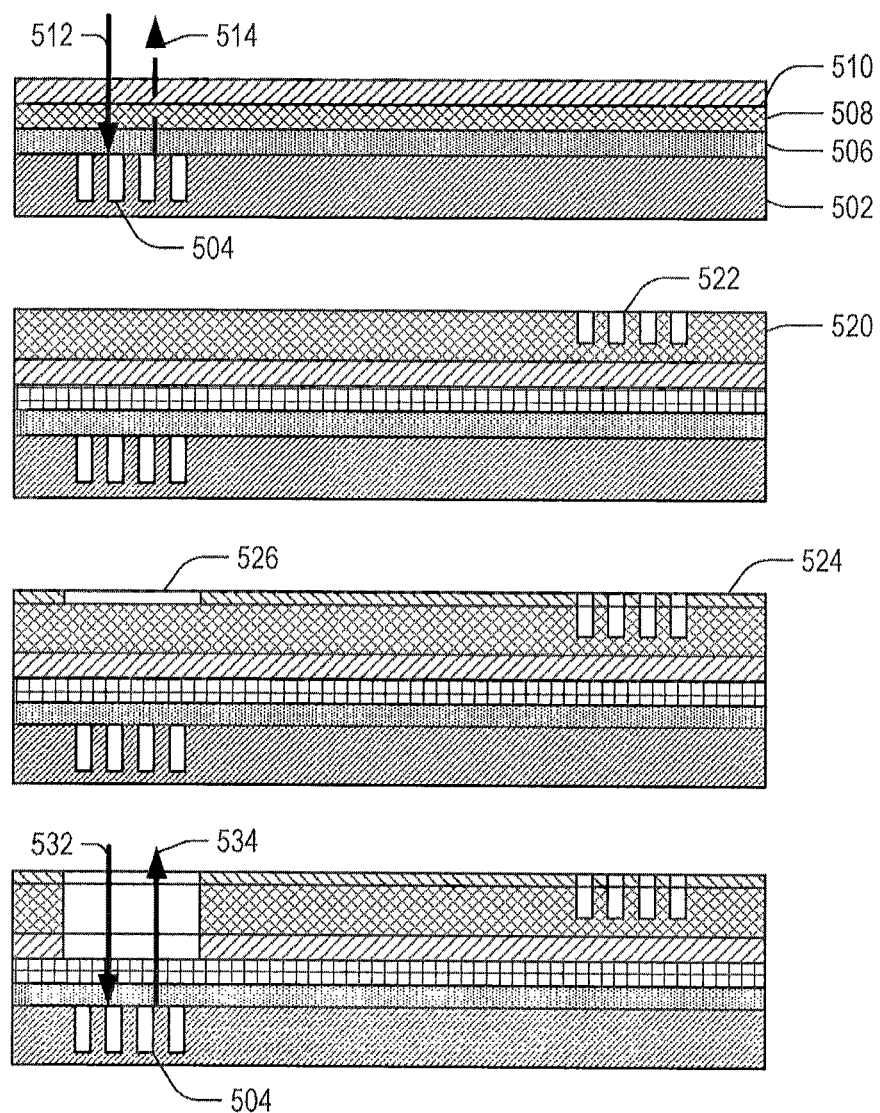
FIG. 5 illustrates schematically the steps of a method of increasing visibility of alignment marks on a substrate.

FIG. 5 shows an example of a method of providing a clear-out window. A substrate 502 has a number of alignment marks 504 on its surface. A number of layers 506, 508, 510 have been deposited during the lithographic process. One or more of the layers may be partially or wholly opaque to incoming radiation beam 512. It may therefore not be possible to use any scattered radiation 514 to detect the position of the alignment marks. Effectively, the alignment marks may be invisible to the radiation used by the alignment sensor.

In order to render these alignment marks visible to the alignment sensor, at least some of the layers on top of the alignment mark are removed. In order to accomplish this, an additional layer 520 is deposited onto the substrate. The additional layer comprises a set of additional alignment marks 522.

The additional alignment marks are then used in the alignment of a further layer 524 that is subsequently deposited onto the substrate. The further layer comprises an optical window 526 ("clear-out window"). The optical window is aligned with the alignment marks 504 and is dimensioned so as to cover the entirety of the alignment mark. Ideally, the optical window is dimensioned so as to match the size of the alignment marks within a small tolerance. This avoids using valuable surface space on the substrate. For this reason, the optical window needs to be in alignment with the alignment marks.

Subsequently, material from the underlying layers 506, 508, 510 can be removed in a suitable manner in the clear-out window region. Material from one or several of the underlying layers can be removed, dependent on the optical properties of the underlying layers. When the one or more layers have been removed, an incoming radiation beam 532 will be scattered by the alignment marks 504 such that the information carrying beam 534 is detectable by the detector of the alignment sensor.

The above-described process is time consuming and typically involves additional marks and an optical window that is aligned within a tight tolerance. This, in turn, involves careful control of the lithographic process, which can negatively impact production speed of the lithographic apparatus.

Thus, it is desirable to, for example, an improved technique for alignment of the clear-out exposure.

Figure 6:
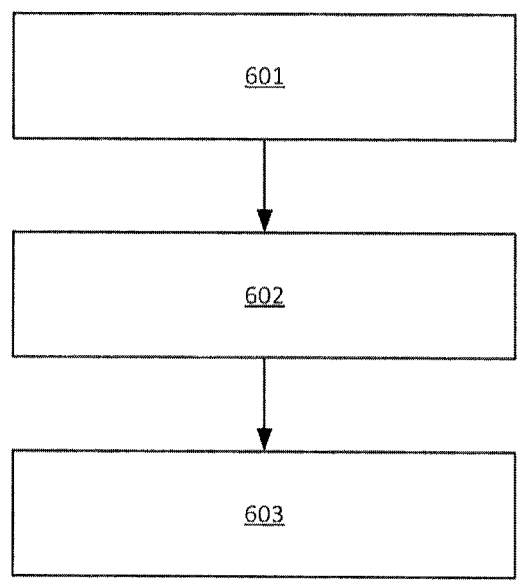
FIG. 6 illustrates an exemplary method for increasing visibility of alignment marks on a substrate.

FIG. 6 shows an exemplary processing method to overcome one or more of the above disadvantages. In a first step 601, one or more first quantities of a substrate are determined. In a second step 602, one or more second quantities of the substrate are determined. The first and second quantities may be, e.g., physical parameters relating to the substrate. This includes, but is not limited to, the position of a point on the edge of the substrate; or the position of a notch on the substrate. In a third step, the substrate is aligned 603 in the lithographic apparatus based on the first and second quantities. After the substrate is aligned, any necessary processing, such as adding the above-described optical window, can be carried out. The exemplary method thereby can obviate the need for adding one or more additional layers and/or one or more alignment marks.

It will of course be appreciated that the exemplary method can be used more generally to aid with the alignment or positioning of a substrate in a lithographic apparatus without the use of an alignment mark.

Figure 7:
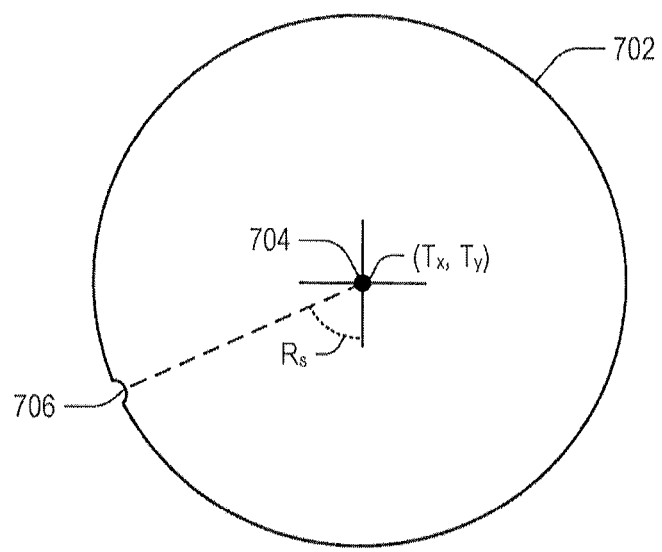
FIG. 7 schematically depicts an exemplary substrate and a set of exemplary parameters determined by the exemplary method.

FIG. 7 depicts a set of exemplary substrate parameters that can be determined by the exemplary method by measuring the first and second quantities as described above. These parameters are used by the lithographic apparatus during the lithographic process to align the substrate. A substrate 702 has a center point 704 with coordinates Tx and Ty (for the x and y coordinates respectively), and a notch 706. In the present example, the notch is arc shaped, although it will be appreciated that the notch could have any suitable geometric shape and size. It is to be noted that the size and shape of a particular notch may be standardized for a particular size and/or shape of substrate, and may therefore be used to identify the type of substrate being measured. In order to align a particular substrate, it is desired to know the orientation of the substrate in addition to the center position. The orientation of the substrate is denoted by the parameter Rs. This parameter is derived by determining the angle of the imaginary line between the center point of the substrate and the notch of the substrate. In the present example, the angle is defined with respect to the y-axis, but it could in principle be defined with respect to any suitable axis that intersects the center of the substrate.

Figure 8:
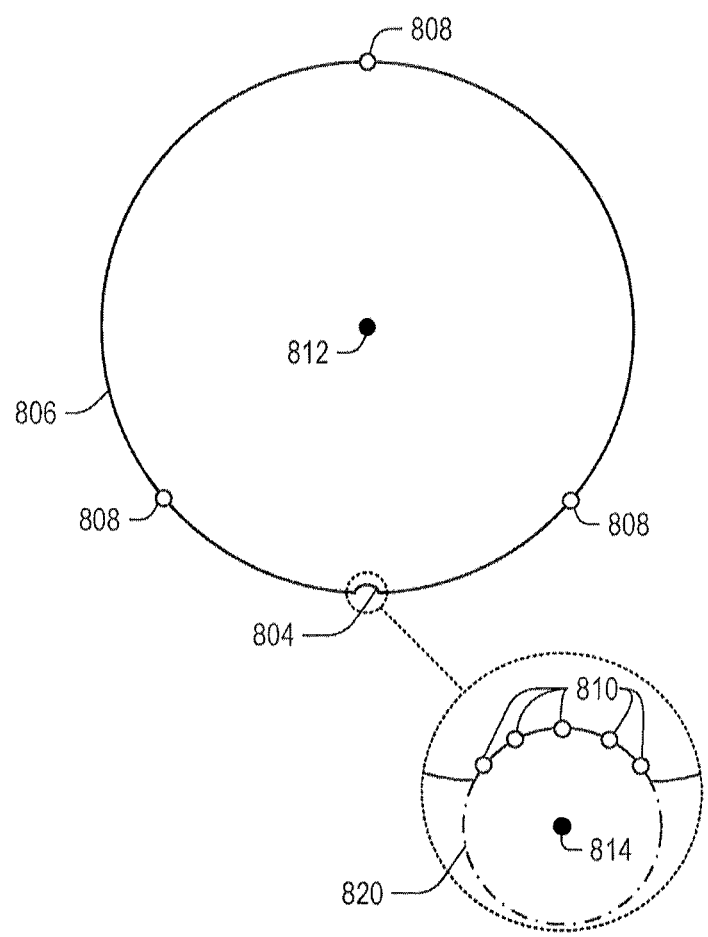
FIG. 8 schematically depicts a set of points to be measured in an exemplary method.
Figure 9:
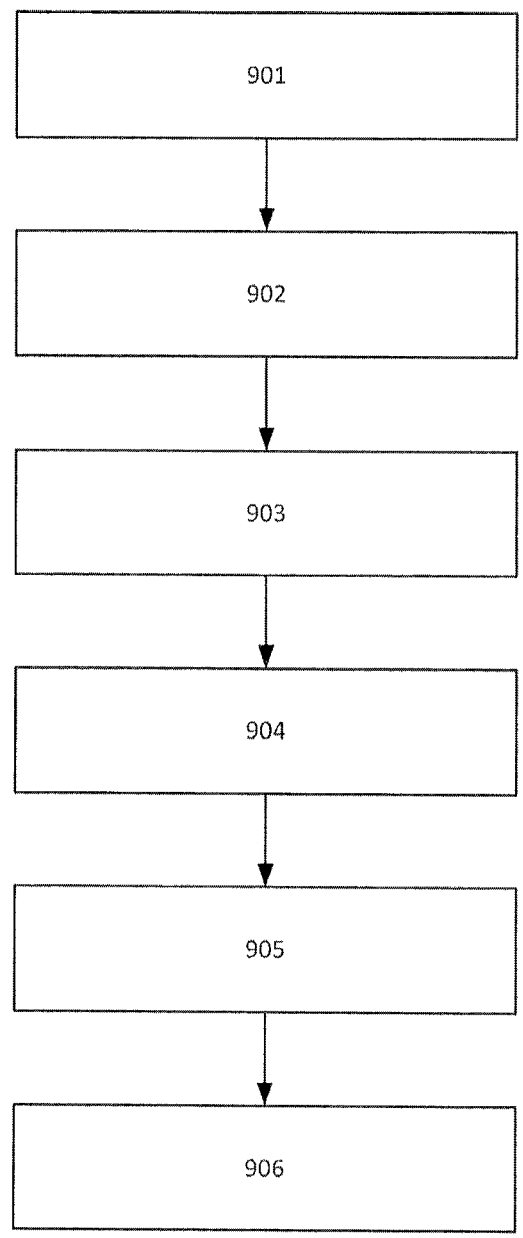
FIG. 9 depicts an exemplary method for increasing visibility of measurement marks on a substrate.

An exemplary processing method will now be described with reference to FIGS. 8 and 9. An exemplary substrate 802 has an arc shaped notch 804 substantially similar to illustrated in FIG. 7.

In step 901, the position of a plurality of points 808 on the edge of the substrate 806 is determined. In the present example, three points are used. The points are distributed substantially equally along the edge of the substrate. In principle, however, any suitable number of points could be used, which have any suitable distribution along the edge of the substrate. As each point to be measured increases the time required to perform the alignment, it is desirable to use as few points as possible in order to accurately determine the center position of the substrate. Three points are sufficient to accurately determine the center position of a substantially circular substrate. However, examples may be envisaged where a smaller or larger number of points are used to determine the center position of a substrate with another, or more complex, geometry. For example, in an embodiment, 4 or more points are used.

In step 902, the position of a second plurality of points 810 along a boundary of the notch 804 is determined. The determination may be carried out in the same fashion as for the edge of the substrate in step 901. Alternatively, any other suitable method may be used to determine the position of the second plurality of points 810. In the present example, the positions of five points are determined, although this is exemplary only. As described above, it is desirable to perform as few measurements as possible in order to reduce the time required to carry out the alignment process.

In step 903, the center position 812 of the substrate is determined based on the determined positions of the points 808 on the edge of the substrate. In the present example, a substantially circular substrate is used. However, embodiments where a non-circular substrate is used may equally well be envisaged.

In step 904, a center position 814 of the notch is determined based on the determined positions of the points 810 on the boundary of the notch. In addition to the determined points, the geometric shape of the notch should be known. In the present example, the notch is substantially arc shaped (as indicated by circle 820). Hence, the center position of the notch is the nominal center of the circle that encompasses the arc shaped notch. In other examples, the notch may have any one of a number of possible shapes. The notch may, without limitation, be a triangle, or may be formed as a flat edge of the substrate. Other shapes may of course be envisaged. It is to be noted that the shape and size of a notch is typically pre-defined for a particular type or size of substrate, as described above.

The center positions of the substrate and the notch are then used to derive 905 the orientation Rs of the substrate. The determined center position of the substrate and the determined orientation of the substrate may subsequently be used in further processing steps 906, e.g. as a reference for determining the position of one or more alignment marks on the surface of the substrate.

In an embodiment, the edge/notch of the substrate can be effectively continuously scanned to take readings a numerous points on the edge/notch. For example, there can be relative movement between substrate a measurement beam at intervals on the micron level in the XY plane in such a way that the edge of the substrate is constantly scanned, giving an improved accuracy with respect to a method in which a discrete number of points is measured.

FIGS. 10A, 10B, 10C, 10D and 10E show a schematic illustration of an exemplary measurement setup to determine a position of a point on an edge. A similar measurement setup may also be used to determine a position of a point on a notch. Herein, references will be mostly made to determining a position of a point on an edge. Such techniques have equal application to measuring a position of a point on a notch.

In an embodiment, an existing optical sensor of the lithographic apparatus is used to determine a position of a point on an edge, such as a level sensor or an alignment sensor. In an embodiment, an alignment sensor is used to determine a position of a point on an edge and in an embodiment, the optical system of the alignment sensor shown in FIG. 4 is used to perform the measuring steps. In an embodiment, an alignment sensor is used to determine a position of a point on an edge that comprises a block to prevent $0^{th}$ order radiation from reaching a detector of the alignment sensor. For example, an alignment sensor that allows radiation coming from a non-perpendicular angle from the substrate to reach the detector. In an embodiment, an alignment sensor is used to determine a position of a point on an edge that comprises a stop to prevent non-$0^{th}$ order radiation from reaching a detector of the alignment sensor. In an embodiment, an alignment sensor is used to determine a position of a point on an edge that comprises a block to prevent $0^{th}$ order radiation from reaching a detector of the alignment sensor and that comprises a stop to prevent non-$0^{th}$ order radiation from reaching a detector of the alignment sensor, which are, in an embodiment, in different optical branches of the alignment sensor or can be selectively provided in a same optical path of the alignment sensor.

Figure 10A:
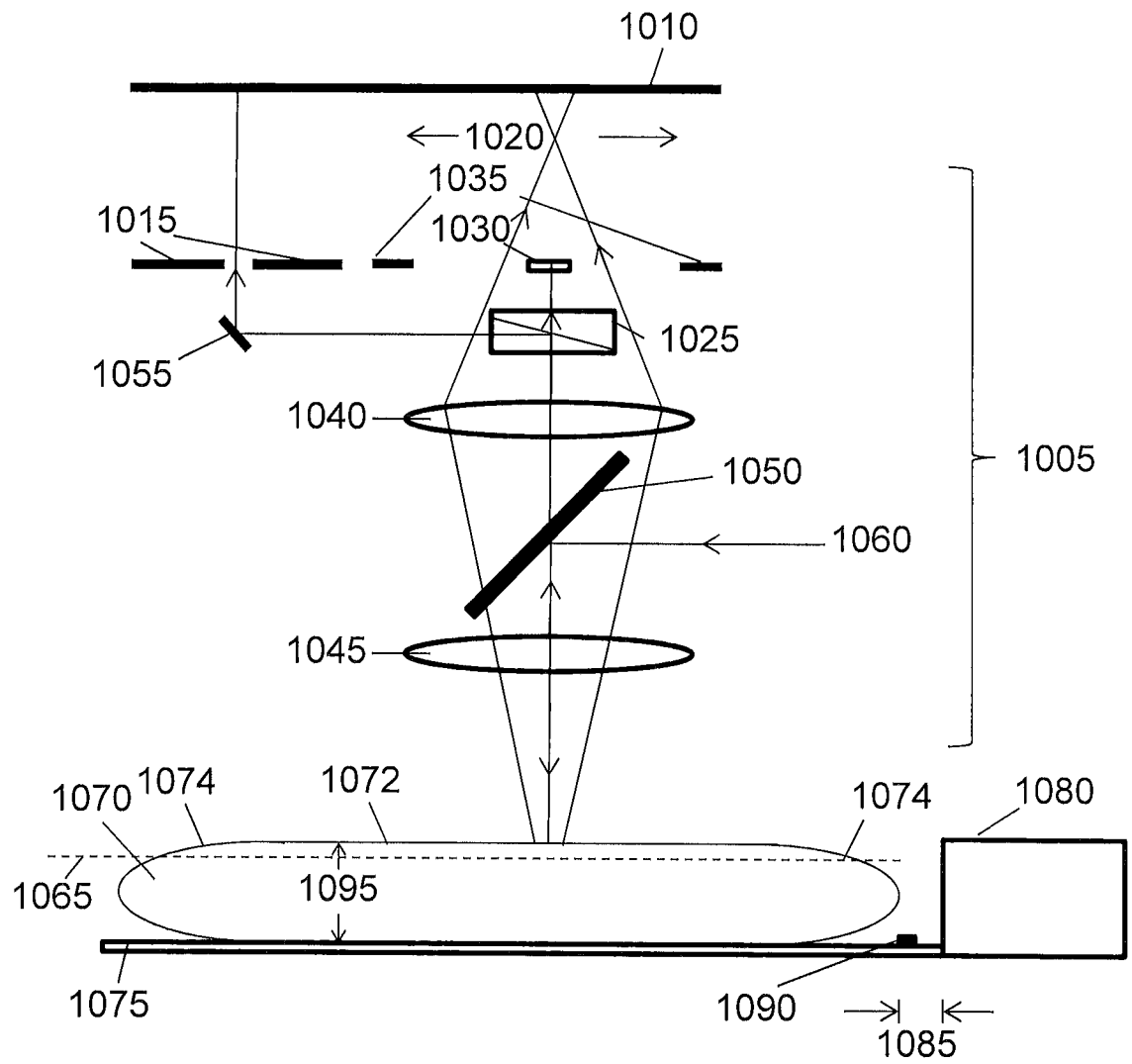
FIGS. 10A, 10B, 10C, 10D and 10E depict schematically the principle of an optical system used to carry out the exemplary method.

Referring to FIG. 10A, a substrate 1070 is depicted on a substrate stage, which includes a substrate holder 1075. In an embodiment, the substrate stage comprises a stage member (e.g., a ring or a recess in the stage) 1080. Only part of the member 1080 is shown. In an embodiment, member 1080 surrounds the substrate 1070. In an embodiment, a gap 1085 between the substrate 1070 and the member 1080 is between 120 μm and 280 μm.

The substrate 1070 has a central surface 1072, on which products (e.g., chips, microprocessors, memory devices, etc.) may be formed, and an edge surface 1074. The edge surface 1074 may be bevelled or curved. A notch on the substrate 1070 as described above is not shown, but would similarly have a boundary surface that may be bevelled or curved. In an embodiment, the thickness 1095 of the substrate 1070 is about 780 μm.

In an embodiment, an optical system 1005 has an illumination source (not shown), which emits an illumination beam 1060. The illumination source may be a laser or a xenon lamp. The illumination beam is directed by the optical element 1050 and propagates through an objective 1045 towards the surface of the substrate 1070 in order to detect the edge position and/or the notch position of the substrate 1070. The objective 1045 has a focal plane indicated by dashed line 1065. In an embodiment, the substrate 1070 is arranged relative to the optical system such that at least a portion of the edge surface 1074 (or the notch boundary surface) is positioned closer to the objective 1045 than the focal length of the objective 1045.

The illumination beam is scattered (e.g., diffracted and/or reflected) by the surface of the substrate 1070 and at least a portion is received by the objective 1045. The scattered radiation (which is analogous to the information carrying beam of FIG. 4) or the reflected radiation then propagates through the optical system 1005, including the objective 1045, the optical element 1050, a lens 1040, a field stop 1035 and a block 1030, toward a detector 1010. Specifically, the lens 1040 is configured to focus the scattered radiation towards the detector 1010. The block 1030 and the field stop 1035 are positioned at the focal plane of the lens 1040 in front of the detector 1010. The field stop 1035 is intended to eliminate most of the radiation from outside the radiation spot (which may be, e.g., about 40 μm in width (e.g., diameter)) on the substrate that scatters to the detector 1010 during alignment measurements. In effect, the detector 1010 will only detect radiation scattered by objects positioned at the focal point of the objective 1045. In an embodiment, the field stop 1035 has a size 1020 of 40 μm. The block 1030 is intended to eliminate most of the directly reflected radiation (e.g., $0^{th}$ order radiation) along the optical axis of the optical system 1005 to the detector 1010.

Figure 12A:
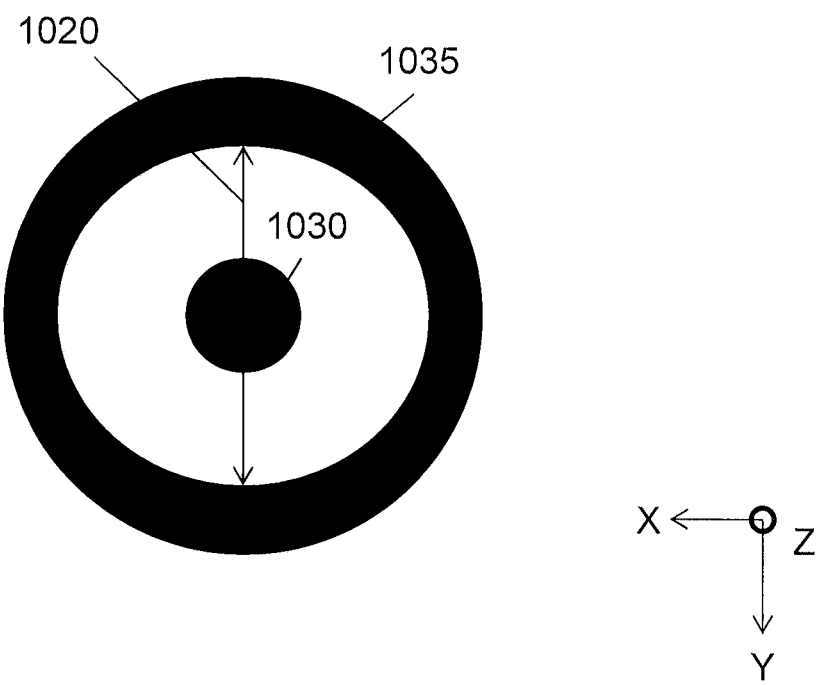
FIGS. 12A and 12B schematically depict different embodiments of a field stop and a block.
Figure 12B:
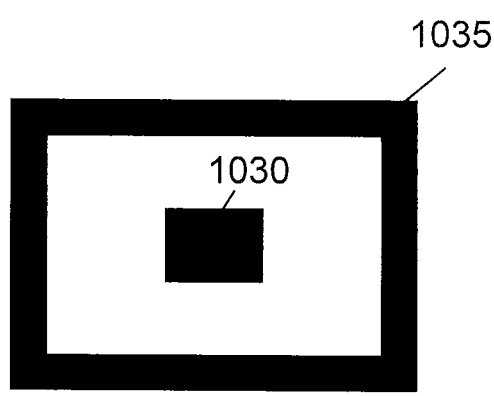

Different embodiments of the block 1030 and the field stop 1035 are shown in top views in FIGS. 12A and 12B. As shown in FIG. 12A, the block 1030 has a circular shape and the field stop 1035 is a circular ring. In other examples, the block 1030 and the field stop 1035 may have another suitable shape. For example, the shapes of the block 1030 may be rectangular and the field stop 1035 may be a rectangular shaped ring similar to FIG. 12B. Unlike shown in FIGS. 12A and 12B, the shape of the aperture of field stop 1035 need not match the outer periphery shape of the field stop 1035. Further, while, in an embodiment, the block 1030 and field stop 1035 are plate elements, the radiation blocking of block 1030 and field stop 1035 can be implemented in many other ways, including, e.g., a spatial light modulator, a liquid crystal device, etc.

Additionally or alternatively to the field stop 1035 and the block 1030, in an embodiment, the optical system 1005 comprises an aperture stop 1015. The aperture stop 1015 is arranged to receive at least part of the scattered radiation 1060 via the beam splitter 1025 and the reflective surface 1055. In an embodiment, the aperture stop 1015 is designed to allow $0^{th}$ order radiation (i.e., the reflected radiation) to pass to the detector 1010, while blocking higher order (e.g., +1, −1, +2, −2, etc. order) radiation. Thus, in this embodiment, In this embodiment, the aperture stop 1015 is arranged to be located in a separate optical branch from the field stop 1035 and the block 1030. Thus, in this embodiment, a measurement technique using the field stop 1035 and the block 1030 as further described below can be performed in parallel with a measurement technique using the aperture stop 1015 or can be performed at another time (e.g., if the beam splitter 1025 selectively directs radiation between going to field stop 1035 and the block 1030 and going to aperture stop 1035) than a measurement technique using the aperture stop 1015.

In an embodiment, the aperture stop 1015 can be arranged in place of the field stop 1035 and the block 1030. In an embodiment, the aperture stop 1015 could be arranged permanently in place of field stop 1035 and the block 1030 (i.e., such that only the measurement technique using the block 1030 is enabled). In an embodiment, the aperture stop 1015 could be arranged non-permanently (e.g., via a rotatable plate or other exchanger) in place of field stop 1035 and the block 1030 such that the measurement technique using the field stop 1035 and the block 1030 is enabled for a certain time and the measurement technique using the aperture stop 1015 is enabled for another time.

Figure 12C:
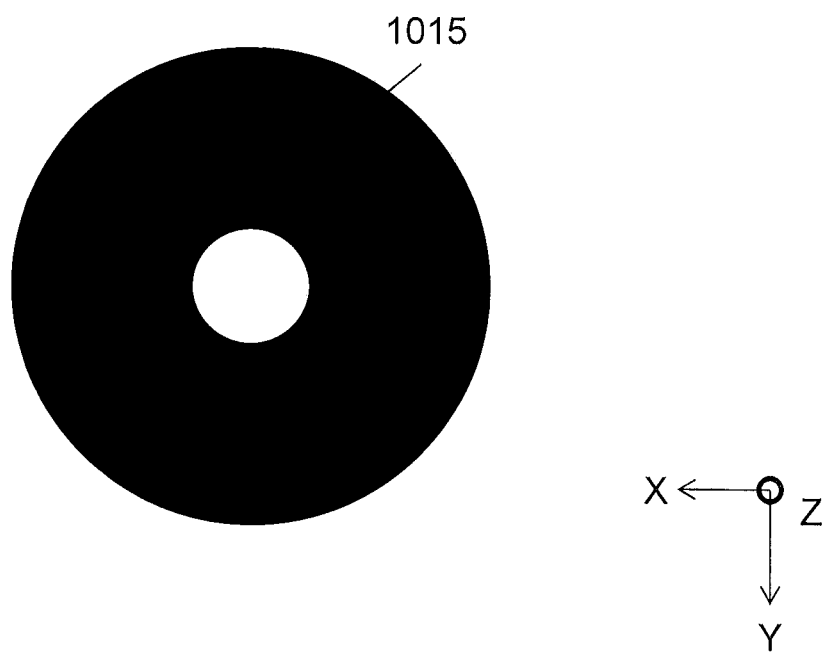
FIGS. 12C and 12D schematically depict different embodiments of a block.
Figure 12D:
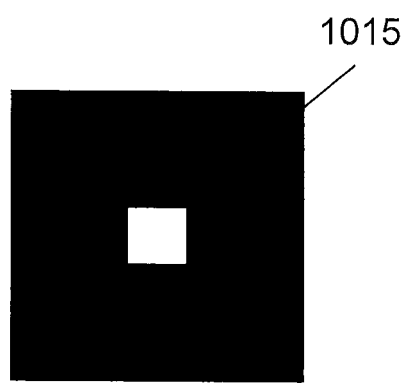

Different embodiments of the aperture stop 1015 are shown in top views in FIGS. 12C and 12D. As shown in FIG. 12C, the aperture stop 1015 has a circular ring shape. In other examples, the aperture stop 1015 may have another suitable shape. For example, the aperture stop 1015 may be a rectangular shaped ring similar to FIG. 12D. Unlike shown in FIGS. 12C and 12D, the shape of the aperture of aperture stop 1015 need not match the outer periphery shape of the aperture stop 1015. Further, while in an embodiment, the aperture stop 1015 is a plate element, the radiation blocking of the aperture stop 1015 can be implemented in many other ways, including, e.g., a spatial light modulator, a liquid crystal device, etc.

Further, while a single detector 1010 is shown (e.g., of which different parts can be used for measurements using the field stop 1035 and the block 1030 and using the aperture stop 1015), a plurality of detectors 1010 could be provided, at least one used for measurement using the field stop 1035 and the block 1030 and at least another one used for measurement using the aperture stop 1015.

The principles of using the optical system 1000 to determine a position of a point on an edge will now be explained. A similar principle may be applied to determine a position of a point on a notch. In order to detect an edge of the substrate 1070, there is relative movement between the beam 1060 and the substrate 1070. It should be noted that it is immaterial whether the optical system 1005 moves or whether the substrate 1070 moves. In some examples, the optical system 1005 may move using one or more actuators (not shown) and the substrate 1070 may be stationary. In other examples, the optical system 1005 may be stationary and the substrate 1070 may move using one or more actuators of the substrate stage (not shown). In yet other examples, both the optical system 1005 and the substrate 1070 move along one or more axes using respective one or more actuators.

In an embodiment, a structure 1090 is situated beneath one or more parts of the edge(s) of the substrate 1070 in order to facilitate determination of a position of the one or more parts of the edge(s). In an embodiment, the structure re-directs at least a portion (e.g., at least 30%, at least 40%, at least 50%, at least 60%, at least 70%, at least 80%, or at least 90%) of the illumination beam with a redirection angle different than the incident angle on the structure. In an embodiment, the redirection angle is in a tangent or perpendicular plane to the portion of the boundary of the edge or notch underneath which the structure is located. For example, having regard to FIG. 10D, the structure 1090 redirects beam 1060 at a different angle than the incident angle into the Y-Z plane. See, e.g., FIGS. 13A and 13B. In an embodiment, the structure 1090 can comprise or have a reflective surface, e.g., one or more mirrors having a reflective surface at angle to the horizontal. In an embodiment, the structure 1090 can comprise a refractive structure, e.g., a prism.

In an embodiment, the structure 1090 can comprise a diffractive structure. In an embodiment, the structure comprises a grating. The grating of structure 1090 comprises a plurality of features (e.g., lines, such as solid lines or broken lines, an array of features having elongate rows of features, etc.). In an embodiment, each of the features has a direction of elongation that is in a direction transverse (e.g., essentially perpendicular) to the part of the edge(s), or to a tangent of the part of the edge(s), of the substrate 1070 under which the grating is located. Or, the features have a direction of elongation extending away, at the portion of the edge or notch underneath which the grating is located, from a central region of the substrate. This is designed so that when a radiation beam illuminates the structure 1090, the grating of the structure 1090 diffracts at least part of the radiation beam to the objective 1045 in a direction essentially perpendicular to the part of the edge(s) of the substrate 1070, e.g., in the Y-Z plane in FIGS. 10A-10E. Otherwise, the diffracted radiation may be deflected toward the substrate 1070 and/or the member 1080, and the diffracted radiation may not be received by the objective 1045.

Figure 11A:
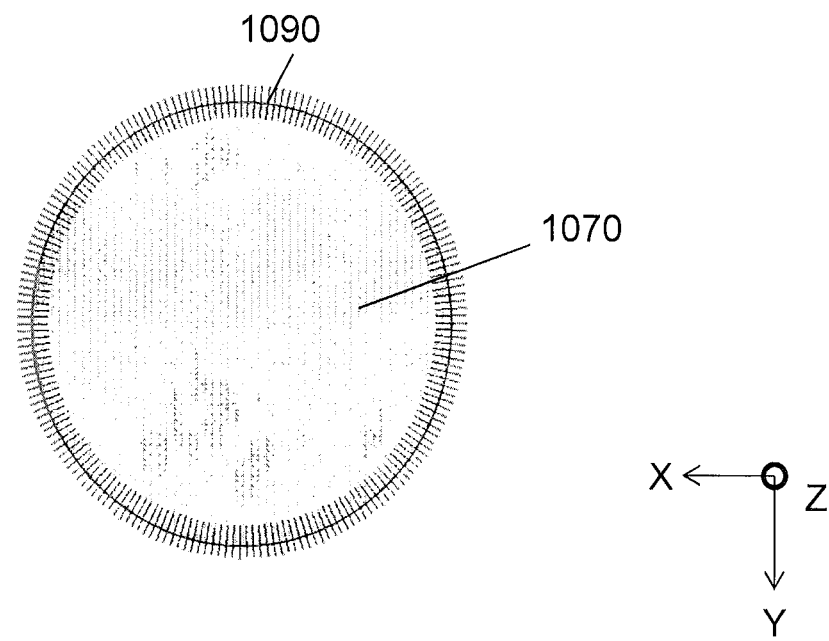
FIG. 11A schematically depicts a top view of a structure beneath an edge of a substrate.

In an embodiment, the shape of the structure 1090 is determined based on the periphery of the substrate 1070. FIG. 11A depicts a top view of the substrate 1070 with the structure 1090 situated beneath the edge of the substrate 1070. As shown in FIG. 11A, the structure 1090 has a circular ring shape. This is because the periphery of the substrate 1070 is a circle. Accordingly, in this example, the structure 1090 can comprise a radial grating, wherein features of the grating have a direction of elongation from a central region of the substrate 1070 as shown in FIG. 11A. In some other examples, a rectangular ring shape grating may be situated beneath the edge of a rectangular substrate, for example, in manufacture of a flat panel display. Accordingly, the rectangular ring shape grating may be configured so that each side of the rectangular grating may include a group of essentially parallel elongate features oriented essentially perpendicularly to the respective side.

As shown in FIG. 11A, the structure 1090 is situated beneath essentially all of the edge of the substrate 1070. In some examples, two or more structures may collectively form the structure 1090 (e.g., a plurality of arc-shaped gratings for a circular substrate). In an embodiment, a plurality of structures 1090 need not match the shape of the substrate 1070. Thus, in the case of a circular substrate, the structures 1090 need not be arc-shaped. Further, it may not be necessary to place one or more structures 1090 beneath all parts of the edge of the substrate 1070. For example, one or more portions of the structure 1090 are placed beneath particular parts of the edge(s) of the substrate 1070.

Figure 11B:
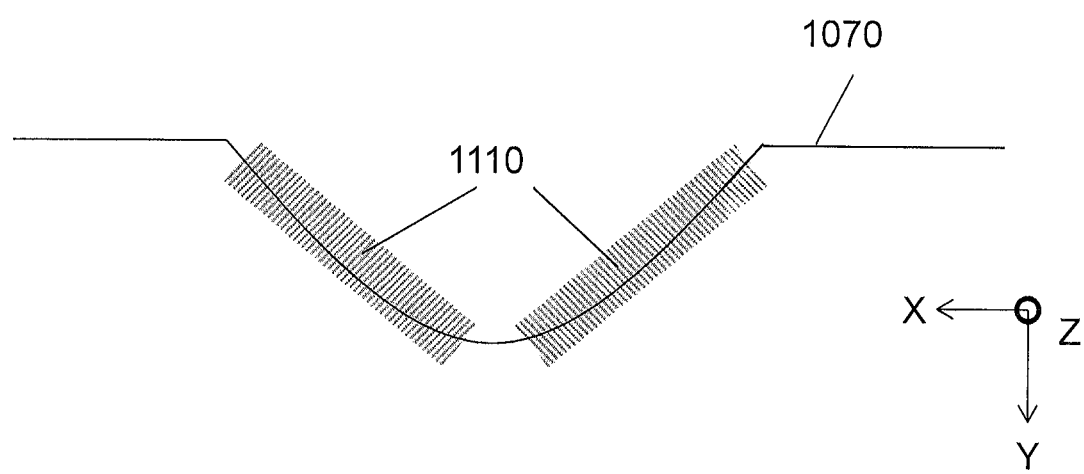
FIG. 11B schematically depicts a top view of structures beneath a notch area of the substrate.

Additionally or alternatively, as shown in FIG. 11B, one or more structures 1110 (e.g., one or more gratings) may be situated beneath the notch area of the substrate 1070 to determine a position of the notch. Similar to a grating of the structure 1090, each of the gratings of structure 1110 comprises a plurality of features. In an embodiment, each feature of the gratings has a direction of elongation that is substantially perpendicular to the parts of the boundary, or to the respective tangent direction of the parts of the boundary, of the notch of the substrate 1070 under which the gratings are located.

FIG. 10A schematically depicts a situation where the beam 1060 is effectively scanned across the central surface 1072 of the substrate 1070. The illumination beam 1060 is directed towards the surface 1072 of the substrate 1070 and is scattered by the surface 1072, upon which the scattered radiation propagates through the optical system 1005 towards the detector 1010, as explained above. In an embodiment, the zeroth order radiation would be blocked by the block 1030. But, as the central surface 1072 of the substrate is not at the focal point of the objective 1045, not all of the scattered radiation is focused into the block 1030 and so the detector 1010 receives some radiation. That is, the amount of the radiation detected by the detector 1010 depends on the position of the focal plane 1065 of the objective 1045. For example, should the focal plane 1065 of the objective 1045 be at the central surface 1072 of the substrate 1070, the radiation would be mostly blocked by the block 1030. But, when the focal plane 1065 of the objective lens 1045 is not at the central surface 1072 of the substrate 1070, at least a portion of the scattered radiation may be detected by the detector 1010 with suitable selection of the block 1030 and/or the field stop 1035. The amount of radiation detected at the detector 1010 may not be critical to determine the position of the edge of the substrate 1070.

Figure 10B:
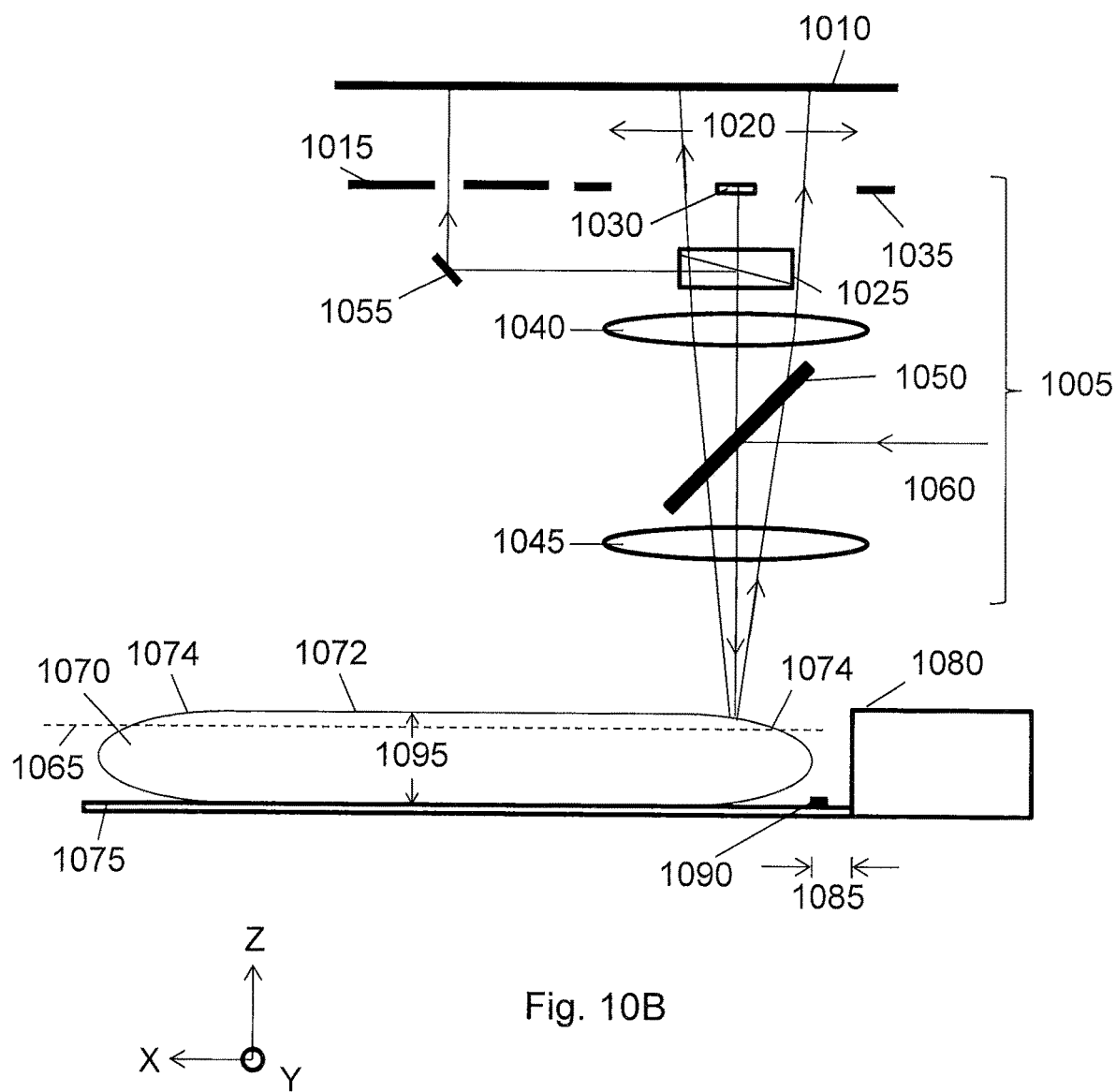

FIG. 10B schematically shows a situation in which the radiation beam 1060 begins to effectively scan the edge surface 1074 of the substrate 1070. At the beginning of the edge surface, the radiation beam 1060 begins to scatter more. Because the curvature is small in the beginning of the edge surface 1074, the relatively small angle enables a larger portion of the scattered radiation to pass through the optical system 1005 to reach the detector 1010. Similar to FIG. 10A, the amount of radiation detected by the detector 1010 may not be critical to determining the position of the edge of the substrate 1070.

Figure 10C:
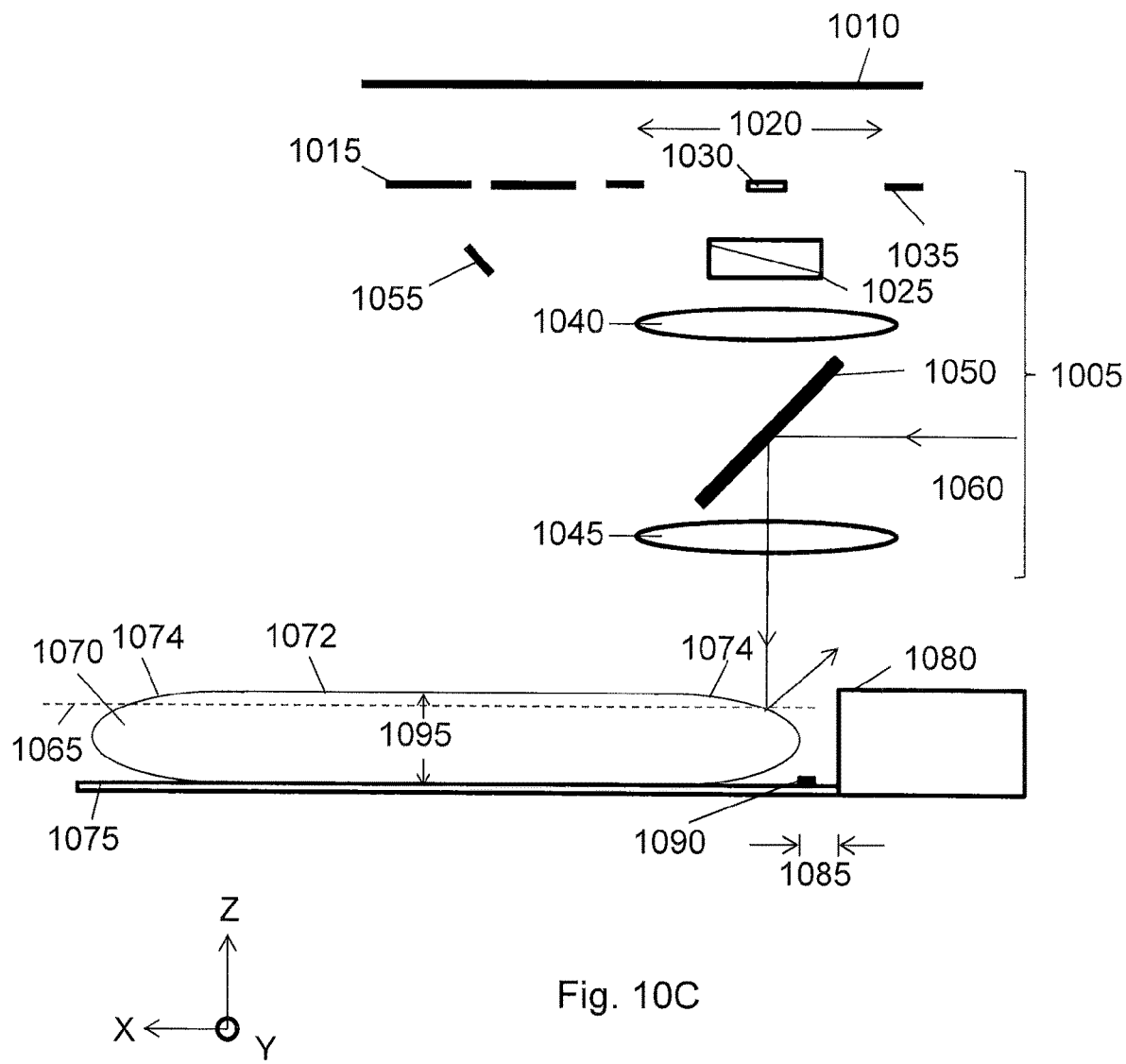

FIG. 10C schematically shows a situation in which the radiation beam 1060 is located closer to the edge of the substrate 1070 on the bevelled surface of the edge surface 1074 of the substrate 1070. Similar to FIG. 10B, the radiation beam 1060 is scattered by the edge surface 1074. However, due to the relatively large curvature, the scattered radiation mostly falls outside of the objective 1045 and/or is mostly blocked by the field stop 1035/block 1030. As a result, little or no radiation is detected by the detector 1010. This could indicate that the edge of the substrate 1070 has been reached. But, the edge of the substrate 1070 has not been reached.

Figure 10D:
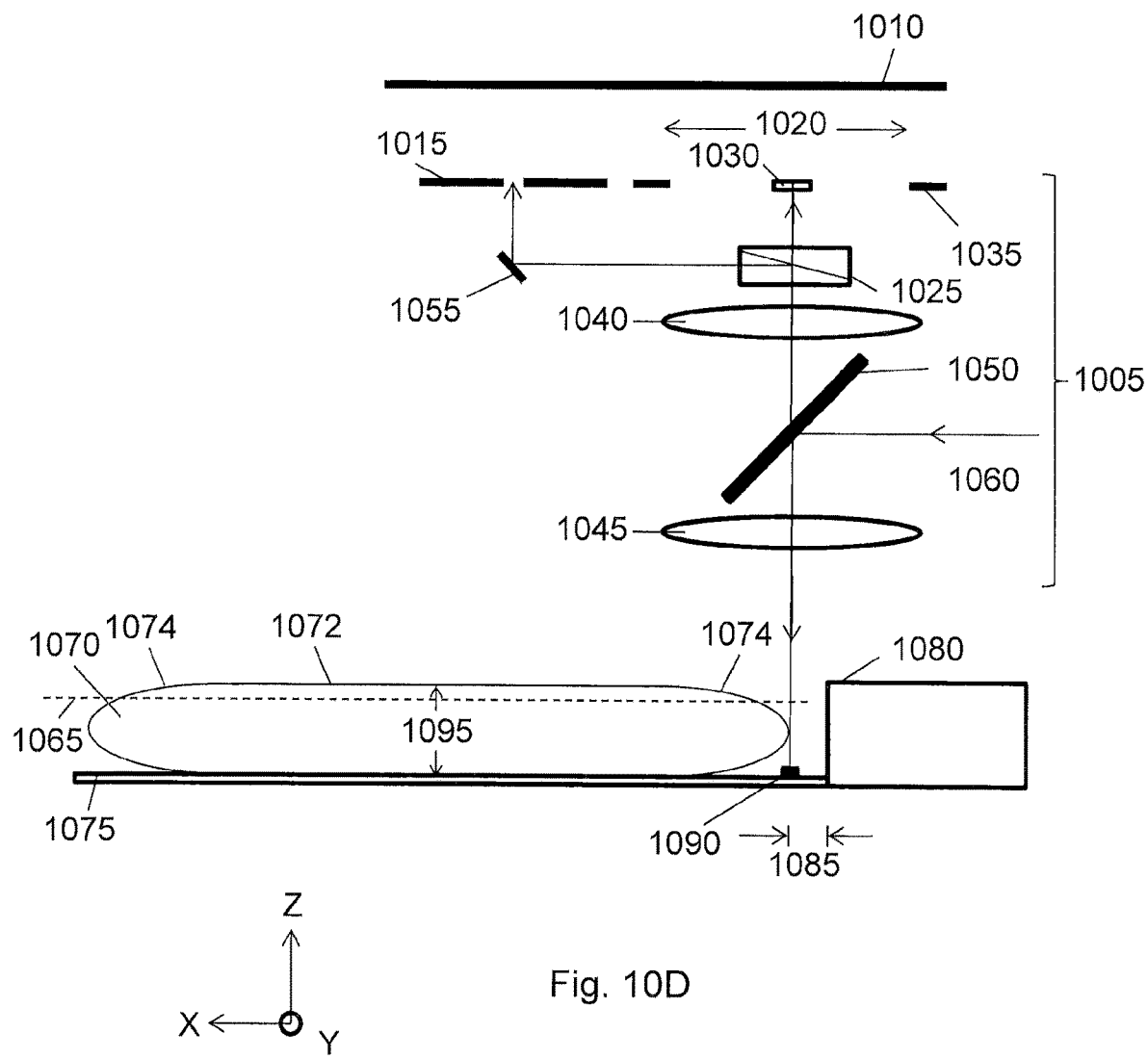

FIG. 10D schematically depicts a situation in which the radiation beam 1060 is directed at the edge of the substrate 1070, i.e., the beam 1060 is over the edge of the substrate 1070. Thus, no radiation will be received by the detector of the optical system if there is no surface to scatter the radiation beam 1060 towards the detector 1010. Further, radiation scattered by a surface that is outside the focal length of the objective 1045 would not be focused through the field stop 1035 and the block 1030 onto the detector 1010. Moreover, in the absence of the structure 1090 underneath the edge of the substrate 1070, any reflected radiation from the surface of the substrate holder 1075 would be blocked by the block 1030. Thus, in the absence of the structure 1090 underneath the edge of the substrate 1070, little or no radiation would reach the detector.

But, in the situation where there is a structure 1090 underneath the edge of the substrate 1070, then at a certain point, the radiation beam 1060 is directed to the structure 1090 beneath the edge of the substrate 1070 and scattered toward the detector 1010 through the optical system 1005. As described, in an example embodiment, the structure 1090 comprises a grating having features that have an elongate direction extending away from the center of the substrate 1070, e.g., in a direction perpendicular to a tangent of the edge of the substrate 1070. As a result, diffracted radiation travels to the objective 1045 in, for example, the Y-Z plane. With an appropriate grating period, the structure 1090 scatters at least part of the radiation beam 1060 with an angle so that the scattered at least part of the radiation beam passes through the optical system 1005 and reaches the detector 1010 without being blocked by the block 1030 and/or the field stop 1035. Accordingly, the position of the edge of the substrate 1070 may be determined based on detection of a significant amount of radiation after detection of no or little radiation on the bevel surface of the edge surface 1074. Thus, the position of a point on the edge may be determined based on the relative position between the radiation beam spot 1060 and the point on the edge of the substrate 1070 when the scattered radiation from the structure 1090 underneath the edge of the substrate 1070 is detected by the detector 1010. That is, when radiation is detected, a position measurement can be taken from, for example, the position sensor IF to arrive at, for example, an X-Y position of the point on the edge of the substrate 1070 when the radiation is detected (since the position of the location of the spot of the beam 1060 in the X-Y plane is known). This would be repeated for a plurality of parts of the edge of the substrate 1070. Similarly, the position of one or more parts of the boundary of the notch may be determined when the radiation from the structure 1110 (as shown in FIG. 11B) is detected.

The grating period is determined based on the focal length of the objective 1045, the wavelength of the radiation beam 1060, the numerical aperture of the block 1030, the numerical aperture of the field stop 1035, and the size 1020 of the field stop 1035. In an embodiment, the grating period is in the range of 1 μm to 25 μm, for example in the range of 5 μm to 20 μm. Specifically, varying the focal length of the objective 1045 may change the position of the focal plane 1065 of the objective 1045 with respect to the bottom of the substrate 1070 or the substrate stage. More details will be described in FIGS. 13A and 13B.

Figure 10E:
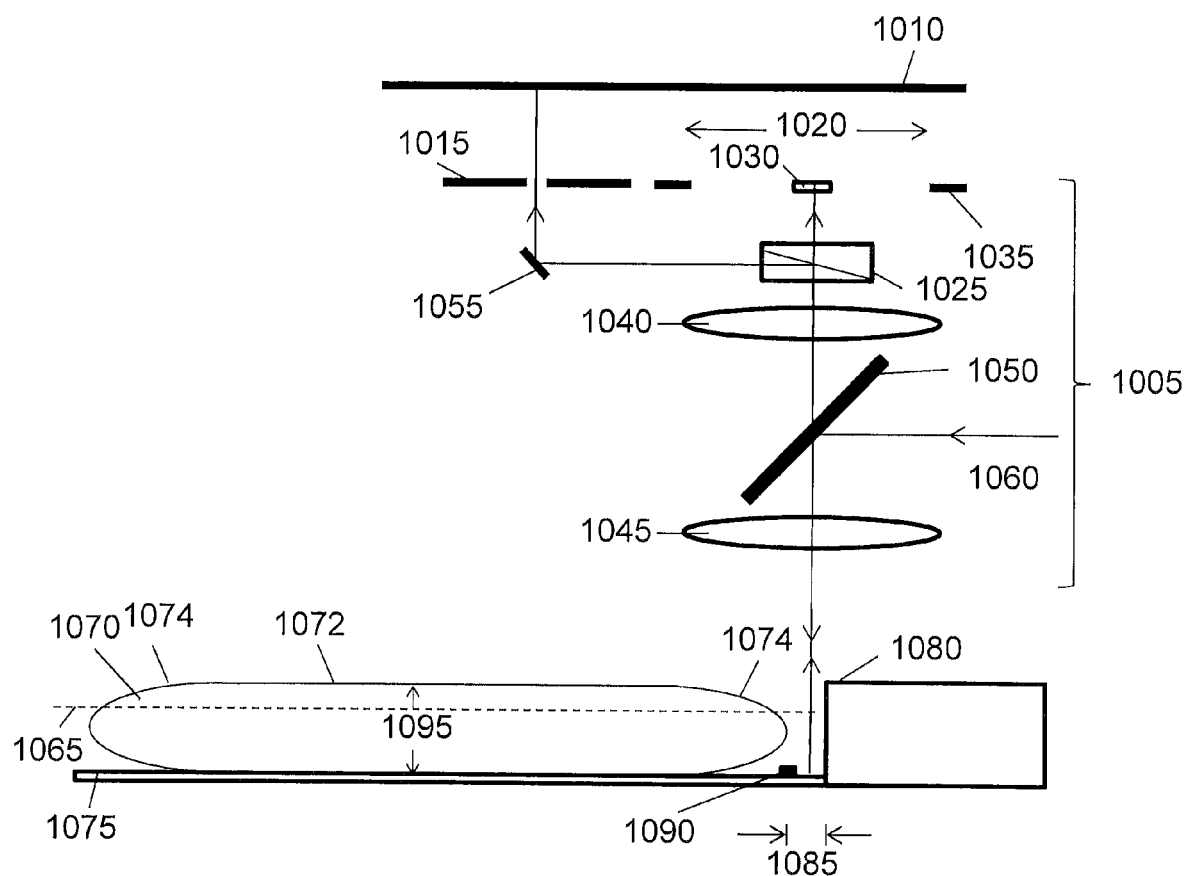

FIG. 10E shows a situation in which the radiation beam 1060 optionally moves further off the substrate 1070 and past the structure 1090. In this situation, the radiation beam 1060 is directed toward the holder 1075 at the bottom of the substrate 1070 and is reflected back toward the objective 1045. The reflected radiation is blocked by the block 1030. As a result, no radiation is detected by the detector 1010.

It will of course be appreciated that the specific implementation of the method described above is exemplary only, and that other implementations of the method may be envisaged.

Figure 13A:
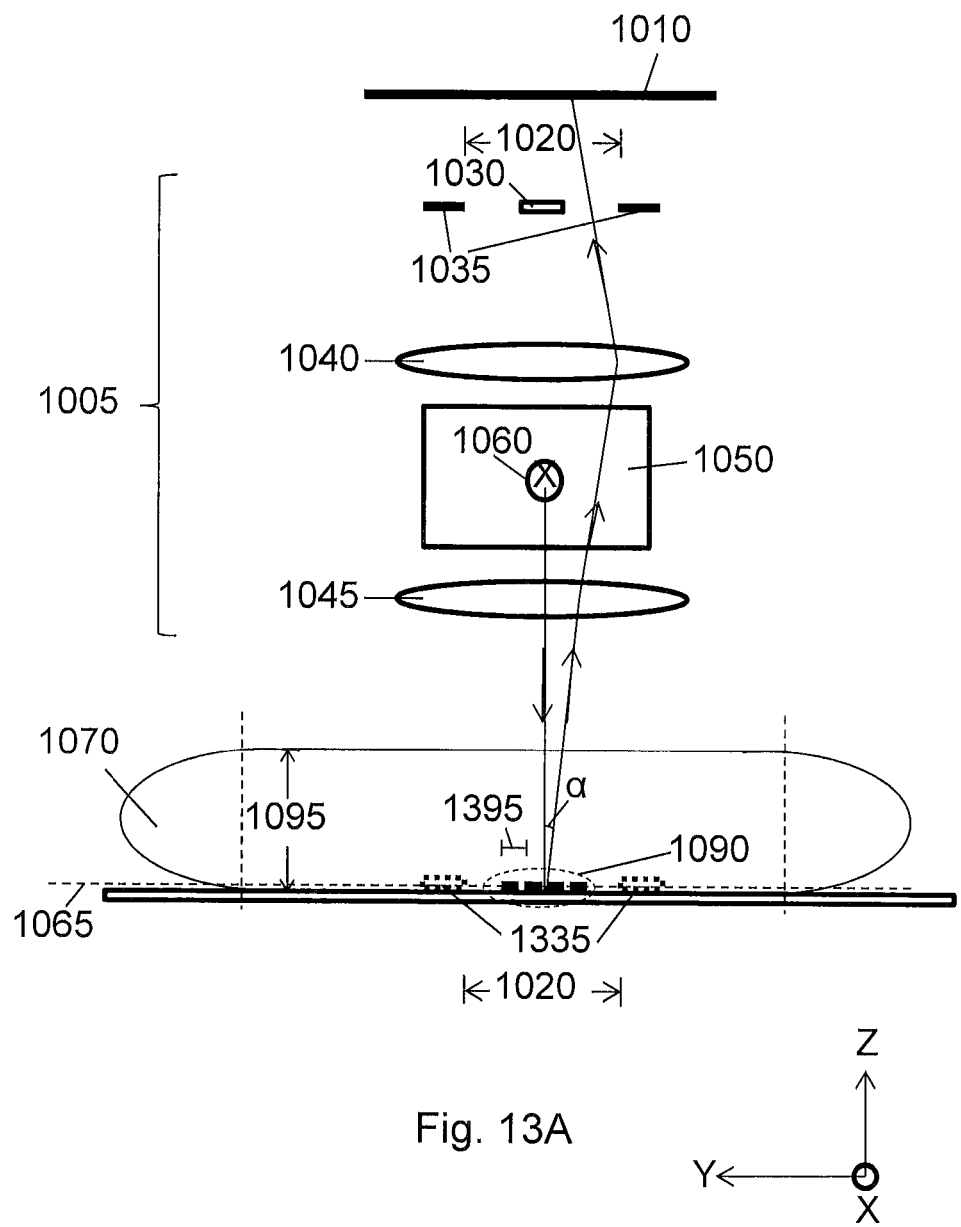
FIGS. 13A and 13B schematically depict the principles of designing a grating according to the optical system for use in carrying out an exemplary method.
Figure 13B:
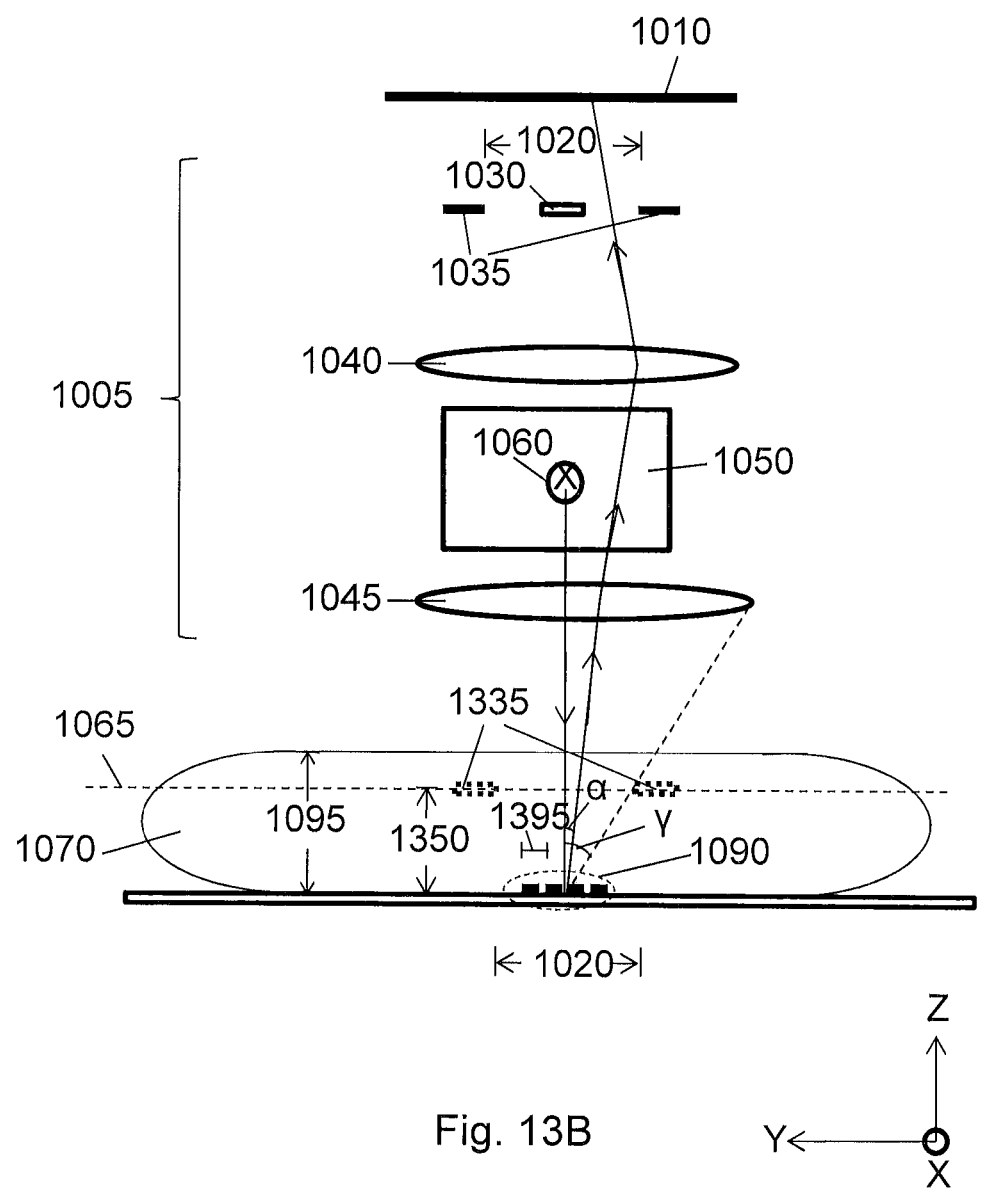

FIGS. 13A and 13B depict a side view of the measurement setup in the situation in which the radiation beam 1060 is directed towards the edge of the substrate 1070 as described in FIG. 10D in order to depict the scattering of the radiation by the structure 1090 underneath the edge of the substrate 1070 and explain principles of determining a grating period of a grating form of the structure 1090. Similar scattering of the radiation and principles of determining a grating period apply to the grating 1010 underneath the notch.

As shown, the radiation beam 1060 is diffracted by a grating of structure 1090 with a diffraction angle α toward the objective 1045. The grating period 1395 (denoted by g) is defined as the pitch between adjacent features of the grating as shown in FIGS. 13A and 13B, which may be expressed by:

$$g = \frac{m\lambda}{\sin(\alpha)} \quad (1)$$

where m is the order of mode of diffraction by the grating, λ is the wavelength of the radiation beam 1060, and α is the diffraction angle. Specifically, m may be any suitable non-zero integer. This is because when m equals to zero, the zeroth order diffraction radiation is reflected back toward the optical system 1005.

In order to ensure the diffracted radiation can be received by the objective 1045 and the lens 1040, the diffraction angle α should satisfy the following condition:

$$\sin(\alpha) \leq NA\_Optics \quad (2)$$

where NA_Optics is the numerical aperture of the optical system 1005.

Additionally, in order to prevent the diffracted radiation from being blocked by the block 1030, the diffraction angle α should satisfy the following condition:

$$\sin(\alpha) \geq NA\_Block \quad (3)$$

where NA_Block is the numerical aperture of the block 1030.

Further, in order to ensure the diffracted radiation gets through the field stop 1035, the diffracted radiation should effectively get through the image of the field stop 1035 through the lenses 1040 and 1045. Since the field stop 1035 is situated at the focal plane of the lens 1040, the image of the field stop 1035 should be situated at the focal plane of the objective 1045 with the substantially the same size 1020.

In an embodiment, the image 1335 of the field stop 1035 is situated at the bottom of the substrate at the holder 1075 as shown in FIG. 13A. In this situation, the diffracted radiation can get through the image 1335 of the field stop 1035 regardless of the diffraction angle α. In this situation, the grating period 1395 (denoted by g) of the grating may be determined according to equations (1)-(3) as:

$$\frac{m\lambda}{NA\_Optics} \leq g \leq \frac{m\lambda}{NA\_Block} \quad (4)$$

As an example, when NA_Optics is 0.6, NA_Block is 0.03, and the first order of diffraction mode is selected (i.e., m=1), the acceptable range of the grating period (g) may be determined with respective to different wavelengths (λ) as shown in Table 1. According to Table 1, the grating period g may be selected between 1.39 and 17.73 for all the wavelengths listed in Table 1.

TABLE 1

| λ (nm) | Minimal g (μm) | Maximal g (μm) |
|---|---|---|
| 532 | 0.87 | 17.73 |
| 635 | 1.06 | 21.17 |
| 780 | 1.30 | 26 |
| 835 | 1.39 | 27.83 |

In an embodiment, the image 1335 of the field stop 1035 is situated at a distance 1350 from the bottom of the substrate stage as shown in FIG. 13B. In this situation, the diffracted radiation can get through the image 1335 of the field stop 1035 when the diffraction angle α is not greater than the maximum diffraction angle δ, where the maximum diffraction angle δ satisfies:

$$\tan(\delta) = \frac{D}{2S} \quad (5)$$

where D is the size of the field stop 1020, and S is the distance 1350. The distance 1350, S depends on the focal length of the objective 1045 since the summation of S and the focal length of the objective 1045 is equal to the distance between the objective 1045 and the bottom of the substrate 1070 at the holder 1075.

According to equation (5), the diffraction angle α should satisfy the following condition:

$$\alpha \leq \arctan\left(\frac{D}{2S}\right) \quad (6)$$

As a result, the grating period 1395 (denoted by g) of the grating may be determined according to equations (1)-(3) and (6) as:

$$\frac{m\lambda}{\min\left(NA\_Optics, \frac{D}{\sqrt{D^2 + 4s^2}}\right)} \leq g \leq \frac{m\lambda}{NA\_Stop} \quad (7)$$

As an example, when NA_Optics is 0.6, NA_Block is 0.03, and the first order of diffraction mode is selected (i.e., m=1), D is 40 μm, S is 300 μm, the acceptable range of the grating period (g) may be determined with respect to different wavelengths (λ) as shown in Table 2. According to Table 2, the grating period g may be selected between 12.55 and 17.73 for all the wavelengths listed in Table 2.

TABLE 2

| λ (nm) | Minimal g (μm) | Maximal g (μm) |
|---|---|---|
| 532 | 8.00 | 17.73 |
| 635 | 9.55 | 21.17 |
| 780 | 11.73 | 26.00 |
| 835 | 12.55 | 27.83 |

Additionally or alternatively to the detection method using field stop 1035/block 1030, $0^{th}$ order radiation from the substrate can be used in determining a position of an edge of the substrate. In particular, the discovery above that the bevel effectively causes the illumination beam 1060 to scatter can be used to advantage in identifying the transition from the generally planar surface of the substrate to the bevel. This transition can be measured at a plurality of points and then, for example, the center of the substrate can be determined. In an embodiment, the shape of this transition around the center of the substrate closely matches the shape of the outer periphery of the substrate (e.g., it may be circular like the outer periphery of the substrate). In an embodiment, the transition around the substrate may have a generally known shape to facilitate, e.g., center measurement. In an embodiment, as noted above, the shape of the transition around the substrate is circular.

To identify the location of the transition, an illumination beam is provided to be incident on the interior of the substrate and essentially only $0^{th}$ order redirected radiation from the substrate is detected. Relative movement is provided between the illumination beam and the substrate so that the illumination beam transitions from being incident on the interior of the substrate toward being no longer incident on the substrate until at least the illumination beam is incident on the edge of the substrate. When the illumination beam is on the edge and essentially no $0^{th}$ order redirected radiation is measured, then it is known that the transition between the interior surface and the edge is reached. An X-Y coordinate can then be recorded. This procedure can then be repeated to obtain a plurality of X-Y coordinates for center determination.

Referring to back to FIG. 10A, the beam 1060 is effectively scanned across the central surface 1072 of the substrate 1070. The illumination beam 1060 is directed towards the surface 1072 of the substrate 1070 and is scattered by the surface 1072, upon which the scattered radiation propagates through the optical system 1005 towards the detector 1010, as explained above. In an embodiment, at least part of the scattered radiation is split off by beam splitter 1025 and reflected by the mirror 1055 to aperture stop 1015, which is designed to allow essentially only $0^{th}$ order radiation to pass to the detector 1010. So, the part of the detector 1010 associated with aperture stop 1015 receives some radiation.

FIG. 10B schematically shows a situation in which the radiation beam 1060 begins to effectively scan the edge surface 1074 of the substrate 1070. At the beginning of the edge surface, the radiation beam 1060 begins to scatter more. But, because the curvature is small in the beginning of the edge surface 1074, $0^{th}$ order scattered radiation can reach the aperture stop 1015 and reach the part of the detector 1010 associated with aperture stop 1015.

FIG. 10C schematically shows a situation in which the radiation beam 1060 is located closer to the edge of the substrate 1070 on the bevelled surface of the edge surface 1074 of the substrate 1070. Similar to FIG. 10B, the radiation beam 1060 is scattered by the edge surface 1074. However, due to the relatively large curvature, the $0^{th}$ order scattered radiation falls outside of the objective 1045. As a result, little or no radiation is detected by the part of the detector 1010 associated with aperture stop 1015. Thus, this would signal that a transition from the generally planar interior surface of the edge to the bevel of the edge is reached. An X-Y coordinate can then be recorded. This procedure can then be repeated to obtain a plurality of X-Y coordinates for center determination.

In an embodiment, the beam splitter 1025 can be selectively turned on so as to switch between using the field stop 1035/block 1030 and aperture stop 1015. In an embodiment, the $0^{th}$ order detection method is used in conjunction with the grating method to arrive at two measures of, for example, the center.

As noted above, in an embodiment, the arrangement of mirror 1055 and beam splitter 1025 is not required. For example, aperture stop 1015 could be used in place of field stop 1035/block 1030 or could be selectively switched with field stop 1035/block 1030.

So, the techniques described herein advantageously use an existing measurement system (e.g., a diffraction-based alignment system and/or an alignment system configured to measure essentially only the zeroth order) in the tool for other purposes (e.g., alignment) to detect the edge and/or notch of a substrate at multiple locations to determine, e.g., the substrate center or substrate orientation. In particular, relative movement is provided between the measurement system beam and the substrate such that the beam crosses across the edge and/or notch of the substrate, and the resulting scattered radiation signal is analyzed to determine the location of one more parts of the edge of the substrate and/or of the boundary of the notch.

In particular, in an embodiment, the measurement system used is designed to effectively block reflected radiation and capture diffracted radiation that falls within the NA of the measurement system. When applied to the edge and/or notch of the substrate, the crossing of the beam from the measurement system over the edge of the substrate or over the boundary of the notch of the substrate results in a specular reflex at the bevelled surface there. But, the specular reflex may be such that the radiation does not fall within the NA of that measurement system and thus would signal that the edge/boundary has been reached (since radiation past the edge/boundary would not effectively reach the detector of the measurement system and thus indicate that the edge/boundary has been reached). But, in some cases, the edge/boundary of the substrate has not been reached in that circumstance. Moreover, this specular reflex is subject to variations in the bevel shape, one or more films and/or structures at that bevel location, and/or imperfections in the bevel. Thus, these factors suggest that a measurement system that no longer detects radiation at an edge/boundary of a substrate does not necessarily mean the edge/boundary has been reached.

Accordingly, in an embodiment, a grating is provided on the substrate stage below the edge of the substrate and/or boundary of the notch of the substrate, e.g., in a gap between the edge/boundary and a stage member (e.g., a ring). The measurement beam would be effectively scanned across the substrate edge/boundary and effectively no detection signal would be produced by the measurement system while the measurement beam is on the bevel. When the beam is off the physical edge/boundary of the substrate and illuminates the grating, the diffracted signal will be captured by the measurement system. Utilizing this diffracted signal, the physical edge/boundary of the substrate could be accurately determined. Utilizing the position of multiple parts of the substrate edge/boundary, one or more parameters of the substrate (e.g., the substrate center, the substrate orientation, etc.) could be accurately determined.

As discussed, in an embodiment, the grating would be oriented such that at least part of the diffraction radiation is in a tangential or parallel plane to the part of the substrate edge/boundary where the grating is located. A pitch of the grating is provided that would enable capture of the diffracted radiation within the NA and field stop of the measurement system. In an embodiment, the measurement system focal plane would be set to the bottom of the substrate to be focused on the grating. If this were not possible (e.g., due to measurement system constraints and/or substrate stage constraints such as the stage member), the pitch of the grating would be selected such that the diffracted orders are still within the NA and field stop of the measurement system.

In an embodiment, the measurement system used is additionally or alternatively designed to effectively block diffracted radiation and capture reflected radiation that falls within the NA of the measurement system. When applied to the edge and/or notch of the substrate, the crossing of the beam from the measurement system over the edge of the substrate or over the boundary of the notch of the substrate results in a specular reflex at the bevelled surface there. The specular reflex may be such that the radiation does not fall within the NA of that measurement system and thus would signal that the transition from the generally planar surface of the substrate to the bevelled surface of the edge/boundary has been reached. Thus, a location of the transition can be recorded along with one or more other points along this transition, which measured points can then be collectively used to derive, for example, a center of the substrate.

In an embodiment, various techniques could be utilized to enhance the signal quality. For example, filtering can be used to filter particular diffraction orders to detect only one or more desired diffraction orders. For example, the measured diffraction illumination signal can be correlated to the expected diffraction direction of the diffraction order(s) measured. In an embodiment, more than one wavelength can be used. For example, the measured diffraction illumination signal can be correlated to one or more of the plurality of wavelengths to, e.g., increase the signal to noise ratio. In an embodiment, any of numerous center determination techniques can be used.

Thus, the edge and/or notch techniques described can eliminate, for example, printing and etching temporary alignment marks, etc. for a clear-out process of marks on the substrate, which steps increase cost and process time. The position defined by the edge and/or notch of the substrate can be used as the basis to print a clear-out window over the mark desirably without impacting adjacent product structures.

While the description herein has focused on alignment marks and alignment sensor systems, other types of marks can be considered and other sensor systems can be used in the methods and apparatus described herein. For example, the clear-out process may be performed for other marks such as an overlay metrology target. Accordingly, the edge and/or notch detection described can facilitate reducing the processing steps of any clear out process. Further, other sensor systems having a block, such as block 1030, can be used such as an overlay metrology sensor system.

In an embodiment, there is provided a method comprising: directing, by an optical system, an illumination beam to a surface of a substrate; providing relative motion between the directed illumination beam and the substrate until the directed illumination beam is illuminated on a grating underneath an edge or a notch of the substrate; diffracting, by the grating, at least a portion of the illumination beam; and detecting, by the detector, the diffracted illumination.

In an embodiment, the method further comprises determining a position of the boundary of the edge or the notch based on the detected diffracted illumination from the grating. In an embodiment, determining the position of the boundary comprises detecting diffracted illumination after essentially not detecting any illumination when the directed illumination beam was incident on a surface of the substrate. In an embodiment, the grating comprises a plurality of features, each of the features being elongate in a direction transverse to a portion of the boundary, or to a tangent of the portion of the boundary, of the edge or notch underneath which the grating is located. In an embodiment, the grating is a grating with features having a direction of elongation extending away, at the portion of the edge or notch underneath which the grating is located, from a central region of the substrate. In an embodiment, a grating period of the grating is determined based on a numerical factor of a pupil stop, a numerical factor of the optical system, a wavelength of the illumination beam, and a focal length of an objective. In an embodiment, the method further comprises preventing, by a block, a reflected portion of the directed illumination beam from reaching the detector. In an embodiment, the method further comprises determining a center or orientation of the substrate from a plurality of positions determined based on the detected diffracted illumination.

In an embodiment, there is provided a method comprising: directing, by an optical system, an illumination beam to a surface of a substrate; providing relative motion between the directed illumination beam and the substrate until the directed illumination beam is illuminated on a structure underneath an edge or a notch of the substrate; redirecting, by the structure, at least a portion of the illumination beam with a redirection angle different than the incident angle; and detecting, by the detector, the redirected illumination.

In an embodiment, the redirection angle is in a tangent or perpendicular plane to the portion of the boundary of the edge or notch underneath which the structure is located. In an embodiment, the method further comprises determining a center or orientation of the substrate from a plurality of positions determined based on the detected redirected illumination.

In an embodiment, there is provided a method comprising: directing, by an optical system, an illumination beam to a surface of a substrate; providing relative motion between the directed illumination beam and the substrate to transition the directed illumination from being incident on an interior of the substrate toward being no longer incident on the substrate until at least the directed illumination beam is incident on an edge or a notch of the substrate; redirecting at least a portion of the illumination beam by the substrate; and detecting, by a detector, essentially only $0^{th}$ order redirected illumination, wherein the detector transitions from observing $0^{th}$ order redirected illumination for the interior of the substrate and observing essentially no $0^{th}$ order redirected illumination when the edge or notch is reached.

In an embodiment, the method further comprises preventing, by a block, non-$0^{th}$ order redirected illumination from reaching the detector. In an embodiment, the method further comprises determining a position of the boundary of the edge or the notch based on the transition of the detector from observing $0^{th}$ order redirected illumination for the interior of the substrate and observing essentially no $0^{th}$ order redirected illumination when the edge or notch is reached. In an embodiment, the method further comprises determining a center or orientation of the substrate from a plurality of positions determined based on the transition of the detector from observing $0^{th}$ order redirected illumination for the interior of the substrate and observing essentially no $0^{th}$ order redirected illumination when the edge or notch is reached.

In an embodiment, there is provided a computer program product comprising machine-readable instructions configured to causing a processor to perform a method as described herein.

In an embodiment, there is provided an apparatus comprising: a substrate stage configured to support a substrate; an optical system configured to direct an illumination beam to a surface of the substrate; a structure underneath an edge or a notch of the substrate when held by the substrate stage, the structure configured to scatter at least a portion of the directed illumination beam at a redirection angle other than the incident angle of the directed illumination beam to the structure; a detector configured to receive the scattered illumination beam from the structure; and an actuator configured to provide relative motion between the directed illumination beam and the substrate until the directed illumination beam is illuminated on the structure.

In an embodiment, the apparatus further comprises a control system configured to determine a position of the boundary of the edge or the notch based on the detected scattered illumination beam from the structure. In an embodiment, the control system is configured to determine the position of the boundary by detecting diffracted illumination after essentially not detecting any illumination when the directed illumination beam was incident on a surface of the substrate. In an embodiment, the structure comprises a grating. In an embodiment, the grating comprises a plurality of features, each of the features being elongate in a direction transverse to a portion of the boundary, or to a tangent of the portion of the boundary, of the edge or notch underneath which the grating is located. In an embodiment, the grating is a grating with features having a direction of elongation extending away, at the portion of the edge or notch underneath which the grating is located, from a central region of the substrate. In an embodiment, a grating period of the grating is determined based on a numerical factor of a pupil stop, a numerical factor of the optical system, a wavelength of the illumination beam, and a focal length of an objective. In an embodiment, the apparatus further comprises a block configured to prevent a reflected portion of the directed illumination beam from reaching the detector. In an embodiment, the redirection angle is in a tangent or perpendicular plane to the portion of the boundary of the edge or notch underneath which the structure is located. In an embodiment, the apparatus further comprises a control system configured to determine a center or orientation of the substrate based on the detected scattered illumination beam from the structure.

One or more operations of the apparatus or method described herein can be effected by a control system. In an embodiment, the control system comprises a combination of hardware and software. The software can comprise instructions configured to cause a hardware processor to cause performance of one or more operations.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that the embodiments may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments have been described above, it will be appreciated that the invention may be practiced otherwise than as described. For example, an embodiment may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method comprising:
   directing, by an optical system, an illumination beam to a surface of a substrate;
   providing relative motion between the directed illumination beam and the substrate until the directed illumination beam is illuminated on a grating underneath an edge or a notch of the substrate;
   diffracting, by the grating, at least a portion of the illumination beam; and
   detecting, by a detector, the diffracted illumination.

2. The method of claim 1, further comprising determining a position of a boundary of the edge or the notch based on the detected diffracted illumination from the grating.

3. The method of claim 1, wherein the grating comprises a plurality of features, each of the features being elongate in a direction transverse to a portion of a boundary, or to a tangent of the portion of the boundary, of the edge or notch underneath which the grating is located.

4. The method of claim 1, wherein the grating is a grating with features having a direction of elongation extending away, at a portion of the edge or notch underneath which the grating is located, from a central region of the substrate.

5. The method of claim 1, wherein a grating period of the grating is determined based on a numerical factor of a pupil stop, a numerical factor of the optical system, a wavelength of the illumination beam, and a focal length of an objective.

6. A non-transitory computer program product comprising machine-readable instructions configured to cause a processor system to cause performance of the method of claim 1.

7. A method comprising:
  directing, by an optical system, an illumination beam to a surface of a substrate;
  providing relative motion between the directed illumination beam and the substrate until the directed illumination beam is illuminated on a structure underneath an edge or a notch of the substrate;
  redirecting, by the structure, at least a portion of the illumination beam with a redirection angle different than the incident angle; and
  detecting, by the detector, the redirected illumination.

8. The method of claim 7, wherein the redirection angle is in a tangent or perpendicular plane to a portion of a boundary of the edge or notch underneath which the structure is located.

9. The method of claim 7, further comprising determining a center or orientation of the substrate from a plurality of positions determined based on the detected redirected illumination.

10. A non-transitory computer program product comprising machine-readable instructions configured to cause a processor system to cause performance of the method of claim 7.

11. A method comprising:
  directing, by an optical system, an illumination beam to a surface of a substrate;
  providing relative motion between the directed illumination beam and the substrate to transition the directed illumination from being incident on an interior of the substrate toward being no longer incident on the substrate until at least the directed illumination beam is incident on an edge or a notch of the substrate;
  redirecting at least a portion of the illumination beam by the substrate; and
  detecting, by a detector, essentially only $0^{th}$ order redirected illumination,
  wherein the detector transitions from observing $0^{th}$ order redirected illumination for the interior of the substrate and observing essentially no $0^{th}$ order redirected illumination when the edge or notch is reached.

12. The method of claim 11, further comprising determining a position of a boundary of the edge or the notch based on the transition of the detector from observing $0^{th}$ order redirected illumination for the interior of the substrate and observing essentially no $0^{th}$ order redirected illumination when the edge or notch is reached.

13. The method of claim 11, further comprising determining a center or orientation of the substrate from a plurality of positions determined based on the transition of the detector from observing $0^{th}$ order redirected illumination for the interior of the substrate and observing essentially no $0^{th}$ order redirected illumination when the edge or notch is reached.

14. A non-transitory computer program product comprising machine-readable instructions configured to cause a processor system to cause performance of the method of claim 11.

15. An apparatus comprising:
  a substrate stage configured to support a substrate;
  an optical system configured to direct an illumination beam to a surface of the substrate;
  a structure underneath an edge or a notch of the substrate when held by the substrate stage, the structure configured to scatter at least a portion of the directed illumination beam at a redirection angle other than the incident angle of the directed illumination beam to the structure;
  a detector configured to receive the scattered illumination beam from the structure; and
  an actuator configured to provide relative motion between the directed illumination beam and the substrate until the directed illumination beam is illuminated on the structure.

16. The apparatus of claim 15, wherein the structure is a grating, wherein the grating comprises a plurality of features, each of the features being elongate in a direction transverse to a portion of a boundary, or to a tangent of the portion of the boundary, of the edge or notch underneath which the grating is located.

17. The apparatus of claim 15, wherein the redirection angle is in a tangent or perpendicular plane to a portion of a boundary of the edge or notch underneath which the structure is located.

18. The apparatus of claim 15, further comprising a processor system configured to determine a position of a boundary of the edge or the notch based on the detected scattered illumination beam from the structure.

19. The apparatus of claim 15, wherein the structure comprises a grating with features having a direction of elongation extending away, at a portion of the edge or notch underneath which the grating is located, from a central region of the substrate.

20. The apparatus of claim 15, wherein the structure comprises a grating having a grating period determined based on a numerical factor of a pupil stop, a numerical factor of the optical system, a wavelength of the illumination beam, and a focal length of an objective.

21. The apparatus of claim 15, further comprising a processor system configured to determine a center or orientation of the substrate from a plurality of positions determined based on the detected scattered illumination beam.

* * * * *